United States Patent
Kuroda et al.

(10) Patent No.: US 7,330,386 B2
(45) Date of Patent: Feb. 12, 2008

(54) SEMICONDUCTOR MEMORY DEVICE

(75) Inventors: Naoki Kuroda, Kyoto (JP); Masanobu Hirose, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/491,934

(22) Filed: Jul. 25, 2006

(65) Prior Publication Data

US 2007/0019490 A1    Jan. 25, 2007

(30) Foreign Application Priority Data

Jul. 25, 2005   (JP) .............................. 2005-213889

(51) Int. Cl.
*G11C 7/00*   (2006.01)
(52) U.S. Cl. ...................... 365/203; 365/226; 365/227
(58) Field of Classification Search ................ 365/203, 365/226, 227
See application file for complete search history.

(56) References Cited

U.S. PATENT DOCUMENTS 6,038,170 A * 3/2000 Shiba .................... 365/185.13
6,711,088 B2   3/2004 Hayashi et al.
2003/0202374 A1 10/2003 Hayashi et al.
2004/0027907 A1* 2/2004 Ooishi ....................... 365/226
2004/0109361 A1  6/2004 Eby et al.
2005/0162941 A1  7/2005 Dudeck et al.

FOREIGN PATENT DOCUMENTS

JP    2003-031749    1/2003

* cited by examiner

*Primary Examiner*—Thong Q. Le
(74) *Attorney, Agent, or Firm*—McDermott Will & Emery LLP

(57) ABSTRACT

In a memory cell array, source lines are provided so that each of the source line is connected to ones of memory cells which belong to adjacent two rows and a plurality of source bias control circuits for supplying a source bias potential which is higher than a ground potential and lower than a power supply potential are provided so as to correspond to the source lines, respectively. During a stand-by period, each of the source lines is controlled to be in a state where the source bias potential is supplied and, during an active period, one or more of the source lines which are not connected to one of the memory cells which is to be read out are controlled to be in a state where the source bias potential is supplied.

47 Claims, 27 Drawing Sheets

SEMICONDUCTOR MEMORY DEVICE

CROSS-REFERENCE TO RELATED APPLICATION

The disclosure of Japanese Patent Application No. 2005-213889 filed on Jul. 25, 2005 including specification, drawings and claims are incorporated herein by reference in its entirety.

BACKGROUND OF THE INVENTION

1. Field of the Invention

The present invention relates to a semiconductor memory device such as a mask ROM (read only memory), and more particularly relates to a circuit technique which achieves increase in size and reduction in power consumption for memory cell arrays.

2. Description of the Prior Art

As a read only memory, for example, a contact-type mask ROM has been known. A contact-type mask ROM is a semiconductor memory device which stores data of "0" or "1" according to whether or not a drain of a memory cell transistor constituting a memory cell is connected to a bit line.

In the contact-type mask ROM, the number of memory cells per bit line is increased, thereby realizing increase in the size of a memory cell array. Therefore, suppression of a current steadily generated by an OFF leakage current of a memory cell has been required.

A semiconductor memory device 900 (of FIG. 27) is an example of a contact mask ROM formed so as to have a configuration in which an OFF leakage current is reduced. The semiconductor memory device 900 is so configured that in reading data, a potential difference between a source and a drain in a non-selected memory cell is reduced by making a potential of a source line which is not connected to a memory cell from which data is to be read out be the same potential as a precharge potential of a bit line to reduce an OFF leakage current (see, for example, Japanese Laid-Open Publication No. 2003-31749).

FIG. 27 is a block diagram illustrating a configuration of the semiconductor memory device 900. As shown in FIG. 27, the semiconductor memory device 900 includes a plurality of memory cell arrays 910, a source potential control circuit 920, a plurality of column decoders 930, a plurality of precharge transistors 940, a plurality of read out circuits 950 and an output selection circuit 960.

Each of the memory cell arrays 910 includes a plurality of memory cells 911 in a matrix of n rows and m columns. In each of the memory cell arrays 910, word lines (WL0 through WLn−1) and source lines (SN0 through SNn−1) are provided so as to correspond to the rows of the matrix, respectively. Also, in each of the memory cell arrays 910, bit lines (BL00 through BL1m−1) are provided so as to correspond to the columns, respectively.

Each of the memory cells 911 is specifically formed of a transistor. A gate of each of the memory cells (transistors) 911 is connected to one of the word lines corresponding to one of the rows to which one of the memory cells 911 belongs. A source node of each of the memory cells 911 is connected to one of the source lines corresponding to one of the columns to which one of the memory cells 911 belongs. Each of the memory cells 911 stores data of "0" or "1" according to whether or not a drain is connected to one of the bit lines corresponding to one of the columns to which one of the memory cells 911 belongs.

The source potential control circuit 920 includes a plurality of NOT circuits 921 corresponding to the word lines, respectively. Each of the NOT circuits 921 supplies a signal, obtained by inversion of a level of an associated one of the word lines, to an associated one of the source lines. For example, a signal obtained by inversion of a word line WL0 is supplied to a source line SN0.

Each of the column decoders 930 includes a plurality of switches provided so as to correspond to the bit lines, respectively. The switches receive column selection signals CA0 through CAm−1 indicating which bit line to be selected, respectively. One of the switches connects one of the bit lines which is to be selected to an associated one of the precharge transistors 940 and an associated one of the read out circuits 950.

Each of the precharge transistors 940 precharges an associated one of the bit lines connected to the precharge transistor 940 via an associated one of the column decoders 930 according to a precharge signal (PCLK0 or PCLK1).

Each of the read out circuits 950 reads out data output to an associated one of the bit lines connected there to via an associated one of the column decoders 930 and outputs the data to the output selection circuit 960.

The output selection circuit 960 selects one of two data (SOUT1 and SOUT2) read out by two of the read out circuits 950 according to a selection signal SEL and outputs the selected data.

The operation of the semiconductor memory device 900 formed so as to have the above-described configuration when data is read out from one of the memory cells connected to the word line WL0 will be described with reference to a timing chart shown in FIG. 28.

When the semiconductor memory device 900 is in a stand-by state before a time A, in the semiconductor memory device 900, each of the word lines is the Low (L) level, so that the source lines are all kept at the High (H) level.

For example, when the column selection signal CAm−1 is deactivated in response to a read out request received from the outside at the time A, one of the switches which has received the column selection signal CA0 is turned ON. Thus, a bit line BL00 is connected to an associated one of the precharge transistors 940 and an associated one of read out circuits 950. Next, when the precharge signal PCLK0 is activated and then one of the precharge transistors 940 is turned ON, only the bit line BL00 is precharged to be the H level.

When the selected word line WL0 is activated, a source line SN0 is pulled down to the L level. In this case, the other ones of the source lines than the source line SN0 stay at the H level. In one of the memory cells activated by the word line WL0, when a drain is connected to the bit line BL00, the bit line BL00 is pulled down to the L level. If the drain is not connected to the bit line BL00, the bit line BL00 is kept to be in a state where the bit line BL00 is precharged to the H level.

Next, data (signal) of the bit line BL00 is read out by an associated one of the read out circuits 950. An output signal SOUT0 of the read out circuit 950 is latched at a rise timing of the selection signal SEL and is output as an output DOUT to the outside of the semiconductor memory device 900.

Thereafter, when the word line WL0 returns to the L level, a source node of one of the memory cells 911 connected to the word line WL0 becomes the H level.

As has been described, in the semiconductor memory device 900, when a read out request is received, only one of the source lines connected to selected one of the memory cells is pulled down to the L level, so that an OFF leakage current can be suppressed due to a reverse bias effect in the other ones of the memory cells which are not selected. The OFF leakage current suppression is useful for achieving increase in size of memory cells.

However, in the above-described configuration, since the source lines and the word lines are provided in the one-to-one correspondence, a problem arises in which as a memory capacity is increased, a layout area is increased because of the arrangement of the source lines.

Moreover, when the semiconductor memory device 900 is in a stand-by state, all of respective source nodes of memory cells are kept to be in the H level. Thus, as a memory capacity is increased, while reduction in size is achieved, an OFF leakage current in a memory cell is increased. Accordingly, in the semiconductor memory device as a whole, power consumption tends to be increased.

To suppress an OFF leakage current, a voltage of each source node is preferably 0.1 through 0.2 V (specifically, in the 65 nm process, if a source node voltage is increased by 0.1 V, an OFF leakage current can be suppressed so as to be two orders in magnitude smaller). However, in the known configuration, the source node voltage is increased to the VDD level or the VDD-Vtn (Vtn is a threshold potential of an n-channel transistor constituting a memory cell). That is, there has been a problem in which more power than necessary for suppressing an OFF leakage current is consumed.

SUMMARY OF THE INVENTION

In view of the above-described problems, the present invention has been devised and it is therefore an object of the present invention to provide a semiconductor memory device which achieves reduction in power consumption during a stand-by period and an operation period and increase in size of a memory capacity at the same time.

To solve the above-described problems, a first aspect of the present invention is directed to a semiconductor memory device in which memory cells are arranged in a matrix, each said memory cell being formed of a single transistor. The semiconductor memory device of the first aspect is characterized by including: a plurality of word lines provided so as to correspond to rows in the matrix, respectively, each said word line being connected in common to respective gate terminals of transistors located in an associated one of the rows; a plurality of bit lines provided so as to correspond to columns in the matrix, respectively, each said bit line being connected to at least one of respective drain terminals of transistors located in an associated one of the columns; a plurality of source lines provided so that each said source line corresponds to every adjacent two rows in the matrix and is connected in common to respective source terminals of transistors located in the two rows; a precharge circuit for precharging the bit lines to a precharge potential according to a precharge signal indicating a period for precharging the bit lines; a precharge signal generator circuit for generating the precharge signal; and one or more source bias control circuits for controlling, during an active period in which an operation of reading out data from one of the memory cells, at least one of the source lines which is not connected to said one of the memory cells which is to be read out to be in a state where a source bias potential that is higher than a ground potential and lower than a power supply potential is supplied.

Thus, the source bias potential is supplied to at least one of the source lines during an active period, so that an OFF leakage current in a memory cell can be reduced due to a reverse bias effect.

According to a second aspect of the present invention, the semiconductor memory device of the first aspect is characterized in that each said source line is connected to associated transistors each constituting one of the memory cells in a doped layer.

Thus, consumption of interconnect resources in an interconnect layer for the source lines can be prevented.

According to a third aspect of the present invention, the semiconductor memory device of the first aspect is characterized in that each said source bias control circuit is provided so as to correspond to a power-of-two number of ones of the word lines.

Thus, a layout pitch can be reduced, so that the source bias control circuits can be arranged without increasing a layout area.

According to a fourth aspect of the present invention, the semiconductor memory device of the first aspect is characterized by further comprising a plurality of internal power supply circuits for generating the source bias potential.

Thus, the source bias potential is generated by the internal power supply circuits.

According to a fifth aspect of the present invention, the semiconductor memory device of the fourth aspect is characterized in that the internal power supply circuits are arranged in a one-to-one correspondence with the source lines, respectively.

Thus, respective potentials of the internal circuits can be managed in a simple manner. Therefore, a stable potential can be supplied to the source lines in a simple manner by controlling the potentials of the internal power supply circuits, so that a yield of the semiconductor memory device can be improved.

According to a sixth aspect of the present invention, the semiconductor memory device of the fourth aspect is characterized in that each said internal power supply circuit is located in a memory cell substrate contact region in which each said memory cell is formed.

Thus, the memory cell substrate contact region which has been a dead area according to a known technique can be effectively utilized. That is, the internal power source circuits can be arranged without increasing a layout area.

According to a seventh aspect of the present invention, the semiconductor memory device of the fourth aspect is characterized in that each said internal power supply circuit is provided so as to correspond to multiple ones of the source lines.

Thus, for example, the source bias potential is supplied to each memory cell array as a unit.

According to an eighth aspect of the present invention, the semiconductor memory device is characterized in that each said source bias control circuit is configured so as to control, during a stand-by period in which the semiconductor memory device waits for a memory access request, all of the source lines to be in a state where the source bias potential is supplied and, during the active period, one of the source lines connected to said one of the memory cells which is to be read out to be in a state where a ground potential or a power supply potential is supplied.

Thus, the source bias potential which is lower than a power supply potential is supplied to all of the source lines during a stand-by period, so that, compared to the known semiconductor memory device, a power consumption can be reduced.

According to a ninth aspect of the present invention, the semiconductor memory device of the eighth aspect is characterized in that a value of data to be stored in one of the memory cells is determined, on the basis of whether or not each said memory cell is connected to one of the bit lines to which the respective drain terminals of transistors are connected, and each said source bias control circuit is configured so as to be capable of setting the source bias potential to be a plurality of different levels and set, when a contact layer based on which the value of data to be stored is determined is formed, a level of the source bias potential.

Thus, the source bias potential can be set at a plurality of different levels, for example, by using a fuse or a contact layer based on which a value of output data is determined to be 0 or 1. That is, after an actual device is evaluated, an optimal bias value can be set at the same time as data is written on a ROM, so that improvement of a yield and cost reduction for the semiconductor memory device can be achieved.

A tenth aspect of the present invention is directed to a semiconductor memory in which memory cells are arranged in a matrix, each said memory cell being formed of a single transistor. The semiconductor memory device of the tenth aspect is characterized by including: a plurality of word lines provided so as to correspond to rows in the matrix, respectively, each said word line being connected in common to respective gate terminals of transistors located in an associated one of the rows; a plurality of bit lines provided so as to correspond to columns in the matrix, respectively, each said bit line being connected to at least one of respective drain terminals of transistors located in an associated one of the columns; a plurality of source lines provided so that each said source line corresponds to every adjacent two rows in the matrix and is connected in common to respective source terminals of transistors located in the two rows; a precharge circuit for precharging bit lines to a precharge potential according to a precharge signal indicating a period for precharging the bit lines; a precharge signal generator circuit for generating the precharge signal; a command decoder circuit for outputting, at a timing corresponding to a memory access request from the outside of the semiconductor memory device, an active signal indicating an active period in which the semiconductor memory device is in an operation of reading out data from one of the memory cells; and one or more source bias control circuits for controlling, during a period in which the active signal is output, at least one of the source lines which is not connected to said one of the memory cells which is to be read out to be in a state where a source bias potential that is higher than a ground potential and lower than a power supply potential is supplied.

According to an eleventh aspect of the present invention, the semiconductor memory device of the tenth aspect is characterized in that each said source bias control circuit is configured so as to control, during a stand-by period, all of the source lines to be in a state where a ground potential is supplied and, during the active period, one of the source lines connected to one of the memory cells which is to be read out to be in a state where the ground potential or a power supply potential is supplied.

Thus, during an active period, the source bias potential is supplied to only ones of the memory cells which are not connected to one of the memory cells to be read out.

According to a twelfth aspect of the present invention, the semiconductor memory device of the tenth aspect is characterized in that each said source bias control circuit is configured so as to perform the source line control according to the precharge signal.

Thus, respective potentials of the source lines are controlled as one of the bit lines is precharged. Therefore, an OFF leakage current flowing between one of the bit lines and an associated one of the source line via an associated one of the memory cells can be reduced.

According to a thirteenth aspect of the present invention, the semiconductor memory device of the twelfth aspect is characterized in that each said source bias control circuit is configured so as to perform the source line control at a different timing from a timing of a start of a period in which one of the word lines is activated.

Thus, for example, it becomes possible to activate one of the word lines after precharge of one of the bit lines is completed. Therefore, an error in an operation of reading out one of the memory cells due to noise generated by a precharge operation can be prevented.

According to a fourteenth aspect of the present invention, the semiconductor memory device of the tenth aspect is characterized in that the semiconductor memory device further includes a temperature detector circuit for detecting change in temperature of the semiconductor memory device, and each said source bias control circuit is configured so as to change the source bias potential according to the change in temperature of the semiconductor memory device detected by the temperature detector circuit.

According to a fifteenth aspect of the present invention, the semiconductor memory device of the eleventh aspect is characterized in that the semiconductor memory device further includes a temperature detector circuit for detecting change in temperature of the semiconductor memory device, and each said source bias control circuit is configured so as to change the source bias potential according to the change in temperature of the semiconductor memory device detected by the temperature detector circuit.

According to a sixteenth aspect of the present invention, the semiconductor memory device of the twelfth aspect is characterized in that the semiconductor memory device further includes a temperature detector circuit for detecting change in temperature of the semiconductor memory device, and each said source bias control circuit is configured so as to change the source bias potential according to the change in temperature of the semiconductor memory device detected by the temperature detector circuit.

According to a seventeenth aspect of the present invention, the semiconductor memory device of the thirteenth aspect is characterized in that the semiconductor memory device further includes a temperature detector circuit for detecting change in temperature of the semiconductor memory device, and each said source bias control circuit is configured so as to change the source bias potential according to the change in temperature of the semiconductor memory device detected by the temperature detector circuit.

Thus, for example, under a temperature condition where a large OFF leakage is generated, the source bias potential is set high, while under a temperature condition where a small OFF leakage current is generated, the source bias potential is set low. That is, power consumed in controlling the potentials of the source lines can be minimized according to the temperature of the semiconductor memory device.

According to an eighteenth aspect of the present invention, the semiconductor memory device of the first aspect is characterized in that the precharge potential is the same potential as the source bias potential.

According to a nineteenth aspect of the present invention, the semiconductor memory device of the twelfth aspect is characterized in that the precharge potential is the same potential as the source bias potential.

According to a twentieth aspect of the present invention, the semiconductor memory device of the fourteenth aspect is characterized in that the precharge potential is the same potential as the source bias potential.

According to a twenty first aspect of the present invention, the semiconductor memory device of the fifteenth aspect is characterized in that the precharge potential is the same potential as the source bias potential.

According to a twenty second aspect of the present invention, the semiconductor memory device of the sixteenth aspect is characterized in that the precharge potential is the same potential as the source bias potential.

According to a twenty third aspect of the present invention, the semiconductor memory device of the seventeenth aspect is characterized in that the precharge potential is the same potential as the source bias potential.

Thus, OFF leakage currents in ones of the memory cells located in different rows from a row to which one of the memory cells which is to be read out is connected can be completely eliminated.

A twenty fourth aspect of the present invention is directed to a semiconductor memory device in which memory cells are arranged in a matrix, each said memory cell being formed of a single transistor. The semiconductor memory device of the twenty fourth aspect is characterized by including: a plurality of word lines provided so as to correspond to rows in the matrix, respectively, each said word line being connected in common to respective gate terminals of transistors located in an associated one of the rows; a plurality of bit lines provided so as to correspond to columns in the matrix, respectively, each said bit line being connected to at least one of respective drain terminals of transistors located in an associated one of the columns; a plurality of source lines provided so that each said source line corresponds to every adjacent two rows in the matrix and is connected in common to respective source terminals of transistors located in the two rows; a command decoder circuit for outputting, at a timing corresponding to a memory access request from the outside of the semiconductor memory device, an active signal indicating an active period in which the semiconductor memory device is in an operation of reading out data from one of the memory cells; and one or more source bias control circuits for controlling, during a period in which the active signal is output, at least one of the source lines which is not connected to said one of the memory cells which is to be read out to be in a state where a source bias potential that is higher than a ground potential and lower than a power supply potential is supplied or a high impedance state.

According to a twenty fifth aspect of the present invention, the semiconductor memory device of the twenty fourth aspect is characterized in that each said source bias control circuit is configured so as to control, during a stand-by period in which the semiconductor memory device waits for a memory access request, all of the source lines to be in a state where the ground potential is supplied and, during the active period, one of the source lines connected to said one of the memory cells which is to be read out to be in a state where a ground potential or a power supply potential is supplied.

Thus, during an active period, one or more of the source lines which are not connected to one of the memory cells which is to be read out are set to be in an high impedance state, so that power consumption during the active period can be reduced.

According to a twenty sixth aspect of the present invention, the semiconductor memory device of the twenty fourth aspect is characterized in that the semiconductor memory device further includes a temperature detector circuit for detecting change in temperature of the semiconductor memory device, and each said source bias control circuit is configured so as to control, during the active period, one or more of the source lines which are not connected to said one of the memory cells which is to be read out to a high impedance state or a state where the source bias potential is supplied, according to the change in temperature of the semiconductor memory device detected by the temperature detector circuit.

Thus, one or more source lines are set to be in a high impedance state or a state where the source bias potential is supplied according to a temperature of the semiconductor memory device. Therefore, a semiconductor memory device in which power consumption during an active period is suppressed and which has a property margin can be provided.

According to a twenty seventh aspect of the present invention, the semiconductor memory device of the first aspect is characterized in that the semiconductor memory device further includes: an output circuit for storing and outputting data output to said one of the bit lines; and a command decoder circuit for outputting, at a timing corresponding to a memory access request from the outside of the semiconductor memory device, an active signal indicating an active period in which the semiconductor memory device is in an operation of reading out data from one of the memory cells, the command decoder circuit is configured so as to reset the active signal by itself at its own timing, and the output circuit stores and outputs data output to said one of the bit lines at a timing when the active signal is reset.

According to a twenty eighth aspect of the present invention, the semiconductor memory device of the tenth aspect is characterized in that the semiconductor memory device further includes an output circuit for storing and outputting data output to said one of the bit lines, the command decoder circuit is configured so as to reset the active signal by itself at its own timing, and the output circuit stores and outputs data output to said one of the bit lines at a timing when the active signal is reset.

According to a twenty ninth aspect of the present invention, the semiconductor memory device of the twenty fourth aspect is characterized in that the semiconductor memory device further includes an output circuit for storing and outputting data output to said one of the bit lines, the command decoder circuit is configured so as to reset the active signal by itself at its own timing, and the output circuit stores and outputs data output to said one of the bit lines at a timing when the active signal is reset.

Thus, the period in which the source bias potential is supplied can be minimized. Specifically, even when leakage currents from paths other than the memory cells are generated by supplying the source bias potential, power consumed by the leakage currents can be minimized. Moreover, a timing of data read is controlled by the command decoder circuit itself at its own timing, so that a constant access time can be achieved.

According to a thirtieth aspect of the present invention, the semiconductor memory device of the twenty seventh aspect is characterized in that each said source bias control circuit is configured so as to include a capability switching circuit for switching a capability of supplying the source bias potential among a plurality of different levels and switch, when the source bias potential is supplied to one or more of the source lines which are not connected to said one of the memory cells which is to be read out, a level of the capability of supplying the source bias potential during the active period.

According to a thirty first aspect of the present invention, the semiconductor memory device of the twenty eighth aspect is characterized in that each said source bias control circuit is configured so as to include a capability switching circuit for switching a capability of supplying the source bias potential among a plurality of different levels and switch, when the source bias potential is supplied to one or more of the source lines which are not connected to said one of the memory cells which is to be read out, a level of the capability of supplying the source bias potential during the active period.

According to a thirty second aspect of the present invention, the semiconductor memory device of the twenty ninth aspect is characterized in that each said source bias control circuit is configured so as to include a capability switching circuit for switching a capability of supplying the source bias potential among a plurality of different levels and switch, when the source bias potential is supplied to one or more of the source lines which are not connected to said one of the memory cells which is to be read out, a level of the capability of supplying the source bias potential during the active period.

According to a thirty third aspect of the present invention, the semiconductor memory device of the thirtieth aspect is characterized in that the semiconductor memory device further includes: a precharge circuit for precharging the bit lines to a precharge potential according to a precharge signal indicating a period for precharging; and a precharge signal generator circuit for generating the precharge signal, and each said source bias control circuit is configured so as to switch the capability of supplying the source bias potential once after a precharge period is completed.

According to a thirty fourth aspect of the present invention, the semiconductor memory device of the thirty first aspect is characterized in that the semiconductor memory device further includes: a precharge circuit for precharging the bit lines to a precharge potential according to a precharge signal indicating a period for precharging; and a precharge signal generator circuit for generating the precharge signal, and each said source bias control circuit is configured so as to switch the capability of supplying the source bias potential once after a precharge period is completed.

According to a thirty fifth aspect of the present invention, the semiconductor memory device of the thirty second aspect of the present invention is characterized in that the semiconductor memory device further includes: a precharge circuit for precharging the bit lines to a precharge potential according to a precharge signal indicating a period for precharging; and a precharge signal generator circuit for generating the precharge signal, and each said source bias control circuit is configured so as to switch the capability of supplying the source bias potential once after a precharge period is completed.

According to a thirty sixth aspect of the present invention, the semiconductor memory device of the thirty third aspect is characterized in that the capability of supplying the source bias potential is larger before switching of the capability than after the switching of the capability.

According to a thirty seventh aspect of the present invention, the semiconductor memory device of the thirty fourth aspect is characterized in that the capability of supplying the source bias potential is larger before switching of the capability than after the switching of the capability.

According to a thirty eighth aspect of the present invention, the semiconductor memory device of the thirty fifth aspect is characterized in that the capability of supplying the source bias potential is larger before switching of the capability than after the switching of the capability.

Thus, for example, at a start time of an active period, the source bias potential supply capability is increased to increase potentials of one or more of the source lines which are not connected to one of the memory cells to be read out as quick as possible, so that an access time can be reduced. Moreover, after the potentials of one or more of the source lines which are not connected to one of the memory cells to be read out are increased to the source bias potential, for example, the source bias potential can be supplied with reduced bias capability, for example, so that a small current enough for compensating an OFF leakage current flowing though transistors connected to the associated one of the source lines is supplied. Therefore, power consumption can be reduced.

According to a thirty ninth aspect of the present invention, the semiconductor memory device of the thirtieth aspect is characterized in that each said source bias control circuit is configured so as to change, during the active period, one or more of the source lines which are not connected to said one of the memory cells which is to be read out to a state where the source bias potential is supplied and then to a high impedance state.

According to a fortieth aspect of the present invention, the semiconductor memory device of the thirty first aspect is characterized in that each said source bias control circuit is configured so as to change, during the active period, one or more of the source lines which are not connected to said one of the memory cells which is to be read out to a state where the source bias potential is supplied and then to a high impedance state.

According to a forty first aspect of the present invention, the semiconductor memory device of the thirty second aspect is characterized in that each said source bias control circuit is configured so as to change, during the active period, one or more of the source lines which are not connected to said one of the memory cells which is to be read out to a state where the source bias potential is supplied and then to a high impedance state.

Thus, during a precharge period, after the necessary source bias potential has been supplied, one or more of the source lines which are not connected to said one of the memory cells which is to be read out are made to be in a high impedance state. Therefore, power is consumed only when the source bias potential is supplied. That is, reduction in power consumption can be achieved and an error in a read out operation due to an OFF leakage current can be prevented.

According to a forty second aspect of the present invention, the semiconductor memory device of the thirtieth aspect is characterized in that the semiconductor memory device further includes a temperature detector circuit for detecting change in temperature of the semiconductor memory device, and each said source bias control circuit is configured so as to switch the capability of supplying the source bias potential, according to the change in temperature of the semiconductor memory device detected by the temperature detector circuit.

According to a forty third aspect of the present invention, the semiconductor memory device of the thirty first aspect is characterized in that the semiconductor memory device further includes a temperature detector circuit for detecting change in temperature of the semiconductor memory device, and each said source bias control circuit is configured so as to switch the capability of supplying the source bias potential, according to the change in temperature of the semiconductor memory device detected by the temperature detector circuit.

According to a forth fourth aspect of the present invention, the semiconductor memory device of the thirty second aspect is characterized in that the semiconductor memory device further includes a temperature detector circuit for detecting change in temperature of the semiconductor memory device, and each said source bias control circuit is configured so as to switch the capability of supplying the source bias potential, according to the change in temperature of the semiconductor memory device detected by the temperature detector circuit.

Thus, the capability of supplying the source bias potential can be switched according to the temperature of the semiconductor memory device.

DESCRIPTION OF THE PREFERRED EMBODIMENTS

Hereafter, embodiments of the present invention will be described with reference to the accompanying drawings.

First Embodiment

Figure 1:
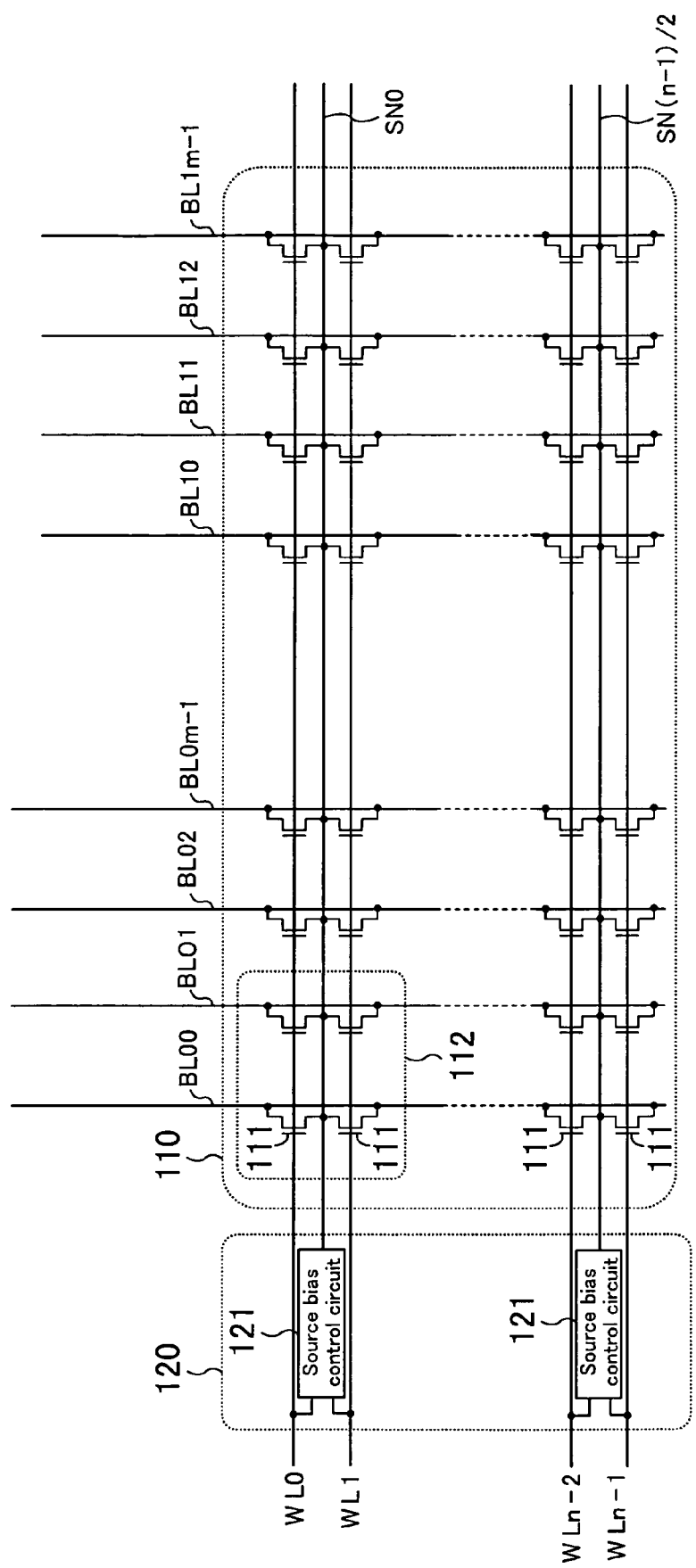
FIG. 1 is a block diagram illustrating a configuration of a semiconductor memory device according to a first embodiment of the present invention.

FIG. 1 is a block diagram illustrating a configuration of a semiconductor memory device 100 according to a first embodiment of the present invention. The semiconductor memory device 100 includes a memory cell array 110 and a source bias control circuit array 120.

The memory cell array 110 includes a plurality of memory cells 111 in a matrix of n rows and 2m columns.

In the memory cell array 110, word lines WL0 through WLn−1 are provided so as to correspond to the rows of the matrix, respectively. Also, in the memory cell array 110, source lines SN0 through SNk (where k=(n−1)/2) are provided so that a single source line is provided for every two adjacent rows of the memory cells. For example, as shown in FIG. 1, the source line SN0 is provided so as to correspond to the word lines WL0 and WL1. In the memory cell array 110, bit lines BL00 through BL1m−1 are provided so as to correspond to columns, respectively.

Each of the memory cells 111 is specifically formed of an n-channel transistor. A gate of each of the memory cells 111 (n-channel transistor) is connected to one of the word lines corresponding to one of the rows to which the memory cell belongs.

A source node of each of the memory cells 111 is connected to one of the source lines corresponding to one of the rows to which the memory cell belongs. For example, a source node in one of the memory cells corresponding to the word line WL0 and a source node in another one of the memory cells corresponding to the word line WL1 are connected in common to the source line SN0. That is, each source node is connected in common to respective source nodes of memory cells located in adjacent two rows.

Each of the memory cells 111 stores data of "0" or "1" according to whether or not a drain is connected to one of the bit lines corresponding to one of the columns to which the memory cell 111 belongs.

Figure 2:
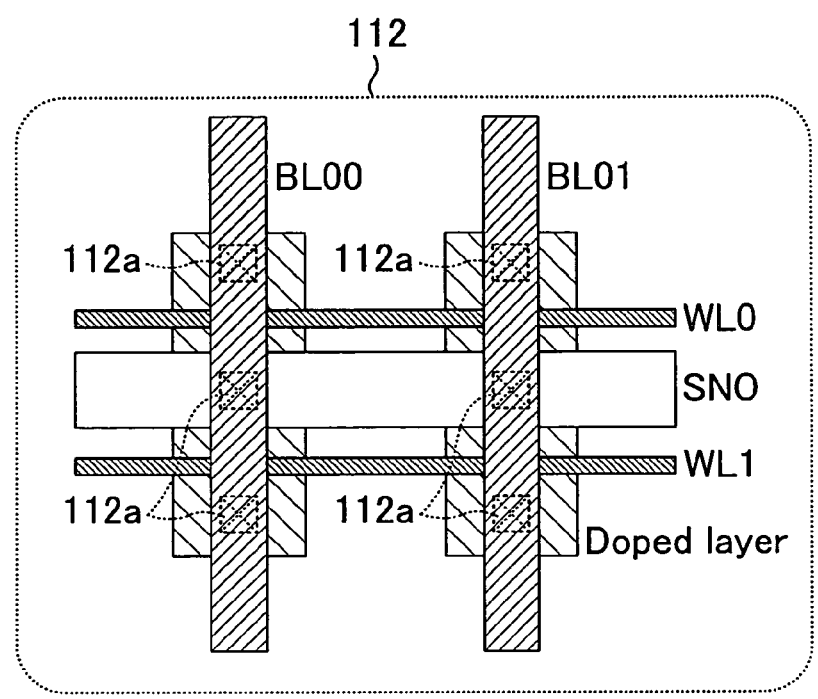
FIG. 2 is an exemplary layout of memory cells on a semiconductor substrate.

The memory cell array 110 is placed on a semiconductor substrate, for example, in the manner shown in FIG. 2. FIG. 2 illustrates part 112 of the memory cell array 110 in which four of the memory cells 111 are located. In this example, the word lines WL0 and WL1, the bit lines BL0 and BL1 and the source line SN0 are located in an interconnect layer. Those interconnects are connected to each of the memory cells through a contact 112a. In this manner, with a layout in which one source line is placed so as to be connected in common to respective source nodes of two memory cells located in adjacent two rows, compared to the case where a source line is provided in each row, a layout area of a memory cell array could be reduced by 15%.

Figure 3:
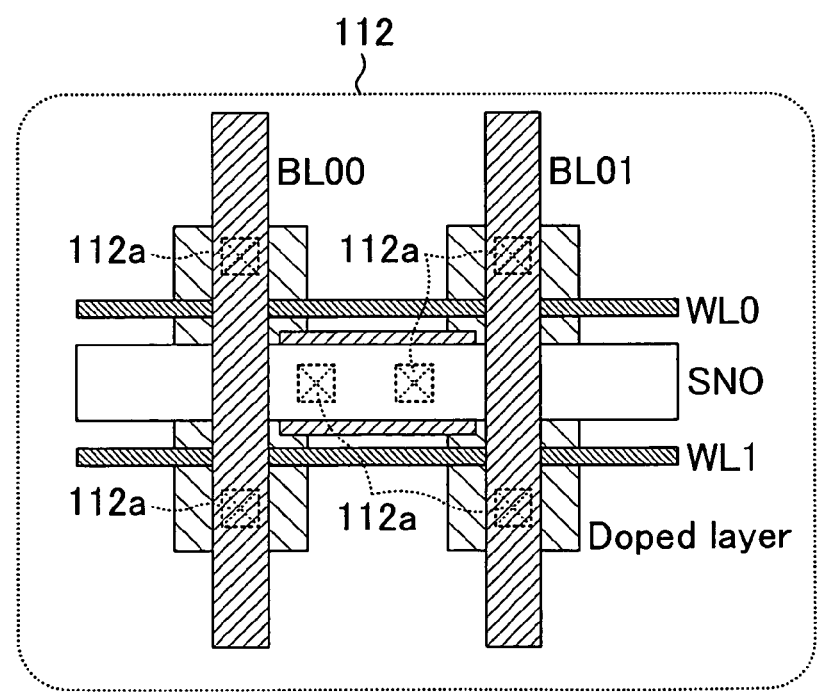
FIG. 3 is an exemplary layout of memory cells on a semiconductor substrate.

The part 112 including four of the memory cells 111 may have, for example, a layout of FIG. 3. FIG. 3 shows a layout example in which source nodes are connected with one another in a doped layer. Thus, an interconnect resource used for connecting source nodes in common can be reduced. Even when the interconnect resource to be consumed can not be reduced, with source nodes connected in common in a doped layer, the risk of defective memory cells caused by defective contacts extending from an interconnect layer can be minimized.

In the source bias control circuit array 120, a plurality of source bias control circuits 121 are provided so as to correspond to the source lines, respectively.

Each of the source bias control circuits 121 controls a potential of an associated one of the source lines according to respective potentials of ones of the word lines corresponding to ones of the memory cells in the two rows. For example, a potential of the source line SN0 is controlled according to respective potentials of the word lines WL0 and WL1.

Figure 4:
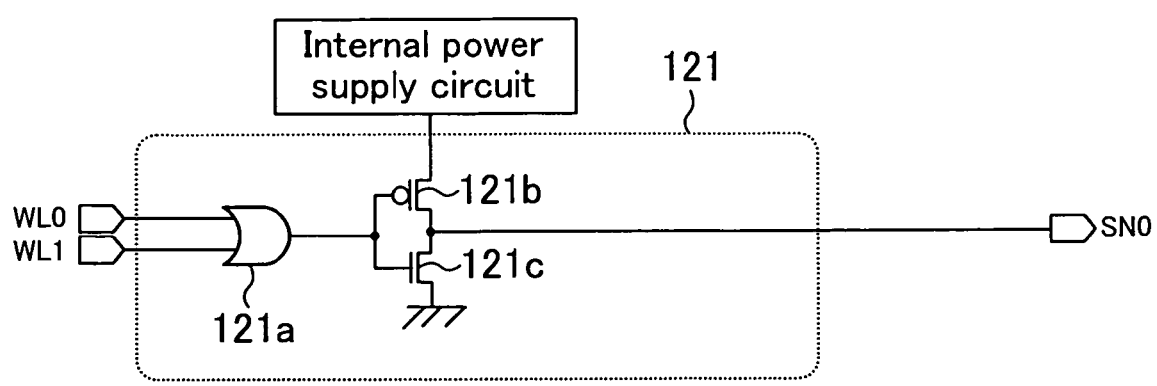
FIG. 4 is a block diagram illustrating a configuration of a source bias control circuit according to the first embodiment of the present invention.

As shown in FIG. 4, each of the source bias control circuits 121 specifically includes an OR circuit 121a, a p-channel transistor 121b and an n-channel transistor 121c. FIG. 4 illustrates an example in which one of the source bias control circuits 121 is connected to each of the word lines WL0 and WL1 and the source line SN0.

A predetermined potential is supplied to a drain terminal of the p-channel transistor 121b from an internal power supply circuit provided in the one-to-one correspondence.

With each of the source bias control circuits 121 having the above-described configuration, when one of two word lines (WL0 and WL1 in this example) connected to the OR circuit 121a becomes the High (VDD) level, the p-channel transistor 121b is turned OFF and the n-channel transistor 121c is turned ON. As a result, a source line (SN0 in this example) becomes the VSS level (ground potential). Moreover, when each of the two word lines becomes the Low level, the p-channel transistor 121b is turned ON and the n-channel transistor 121c is turned OFF. As a result, a potential (source bias potential) is supplied from the internal power supply circuit to an associated one of the source lines. When the source bias potential is supplied to the associated one of the source lines, an OFF leakage current in the memory cells is suppressed due to a reverse bias effect.

If the source bias potential, which is a potential supplied by the internal power supply circuit, is set to be, for example, a power supply potential VDD of the semiconductor memory device 100 or VDD-Vtn (Vtn is a threshold potential of a transistor constituting a memory cell), an OFF leakage current can be substantially eliminated. With a voltage at such a level applied, however, power consumption for supplying a potential to a source line is increased. Therefore, in this embodiment, when the source bias potential is set, the balance between increase in power consumption due to supply of a potential to a source line and reduction in power consumption due to prevention of OFF leakage current is taken into consideration. For example, in a semiconductor memory device in a 65 nm process, a potential of about 0.1 V to 0.2 V is supplied. Thus, an OFF leakage current can be suppressed so as to be two orders in magnitude smaller. In this layout example, the internal power supply circuit is provided in the one-to-one correspondence with each source line. Therefore, the potential of the internal power supply circuit can be managed in a simple manner. That is, a stable potential can be supplied to a source line by adjusting the potential of the internal power supply circuit in a simple manner, so that a yield of the semiconductor memory device can be improved.

Figure 6:
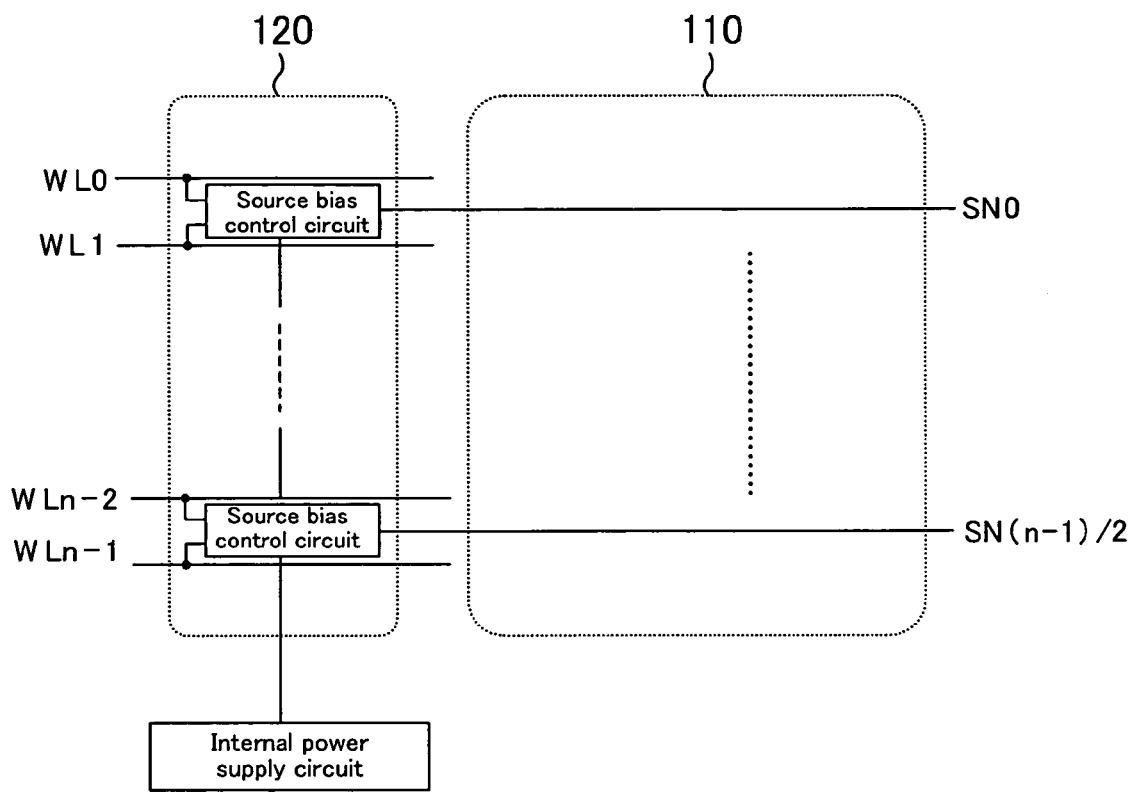
FIG. 6 is an exemplary layout of an internal power supply circuit.

The internal power supply circuit does not always have to be provided in the one-to-one correspondence with each source line. For example, as shown in FIG. 6, the internal power supply circuit may be provided for each memory cell array so that a potential is supplied to the source bias control circuits 121 as a whole in each memory cell array.

Figure 5:
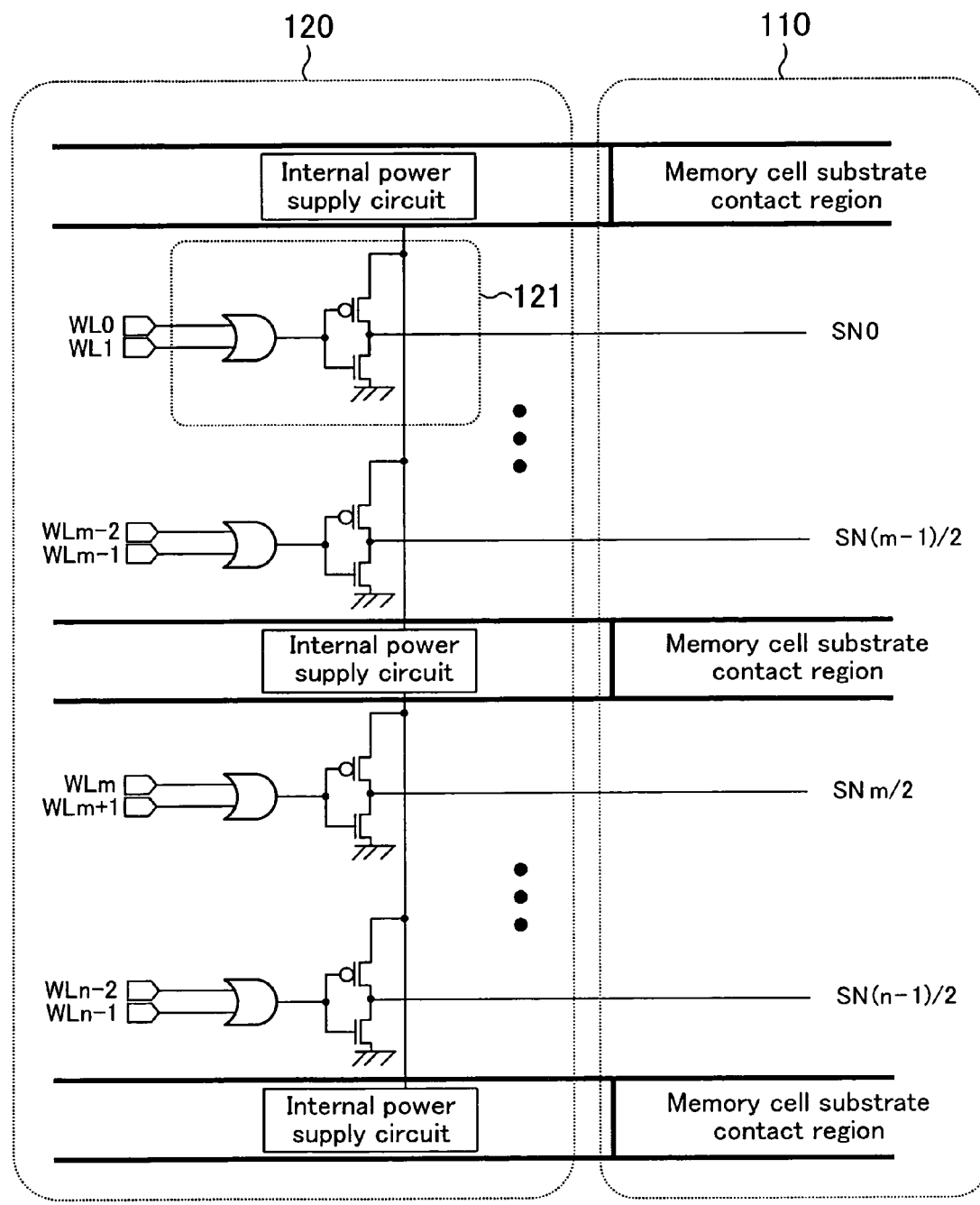
FIG. 5 is an exemplary layout of an internal power supply circuit.

As shown in FIG. 5, if the internal power supply circuit is provided on part of the semiconductor so as to be placed in a memory cell substrate contact region located between a word line group and another word line group, the memory cell substrate contact region, which has been normally a dead area, can be effectively utilized. That is, the internal power supply circuit can be placed without increasing the layout area.

The operation of the semiconductor memory device 100 having the above-described configuration when data is read out from memory cells connected to the word line WL0 and then data is read out from memory cells connected to the word line WL1 will be described with reference to a timing chart of FIG. 7.

Figure 7:
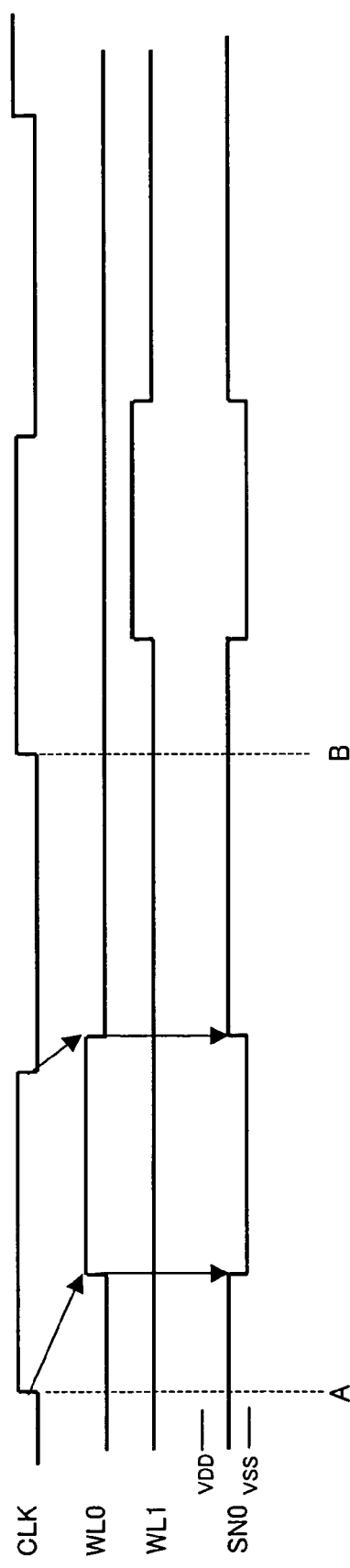
FIG. 7 is a timing chart according to the first embodiment of the present invention.

In FIG. 7, the semiconductor memory device 100 is in a stand-by state (a state in which the semiconductor memory device 100 waits for a memory access request) before a time A. In the stand-by state, the potential of each of the word lines WL0 and WL1 is the Low (VSS) level and the potential of the source line SN0 is the source bias potential.

When a potential of the High (VDD) level is supplied to the word line WL0 and the word line WL0 is activated at the time A, an associated one of the source bias control circuits 121 controls the potential of the source line SN0 to the VSS level. Then, data is read out from an associated one of the memory cells while the word line WL0 is activated.

In this case, respective potentials of the other ones of the source lines than the source line SN0 are kept at the source bias potential. Thus, in ones of the memory cells connected to the source lines other than the source line SN0, an OFF leakage current is reduced due to a reverse bias effect.

Thereafter, when the word line WL0 is reset to be the Low level, the potential of the source line SN0 becomes the source bias potential again.

Next, when the word line WL1 is activated at a time B, the associated one of the source bias control circuits 121 controls the potential of the source line SN0 to the VSS level and data read is performed. Thereafter, when the word line WL1 is reset to the Low level, the potential of the source line SN0 becomes the source bias potential again.

As has been described, according to this embodiment, when the semiconductor memory device 100 is in a stand-by state, the source bias potential which is a lower potential than the power supply potential VDD or VDD-Vtn is supplied. Thus, compared to the known semiconductor memory device, power consumption can be reduced. When the semiconductor memory device 100 is in an active period (which is a period in which the operation of reading data from a memory cell is performed), an OFF leakage current in an associated one of the memory cells can be reduced due to a reverse bias effect.

In this embodiment, one source line is provided in common for adjacent two rows. Thus, the total of load capacities of the source lines is reduced, so that power consumption can be reduced.

When the semiconductor memory device is in an operation, only one of the source lines corresponding to an activated one of the word lines is not operated. Thus, noise reduction and suppression of power supply potential fluctuation can be achieved.

With the source lines placed in the above-described layout, for example, respective potentials of the source lines can be controlled in a simple manner using pre-decoded signals of the word lines WL0 and WL1. The source bias control circuits 121 may be provided so that each of the source bias control circuits 121 is provided for power-of-two word lines. Thus, a layout pitch can be reduced, so that a layout area can be effectively reduced.

In this embodiment, for example, a potential of each source node can be set at various different level by using a fuse or a contact layer based on which a value of output data is determined to be 0 or 1. Thus, after an actual device is evaluated, an optimal bias value can be set at the same time as data is written on a ROM, so that improvement of a yield and cost reduction can be achieved.

Second Embodiment

An example in which a source bias potential is supplied only in a period in which a semiconductor memory device is in an active period will be described.

Figure 8:
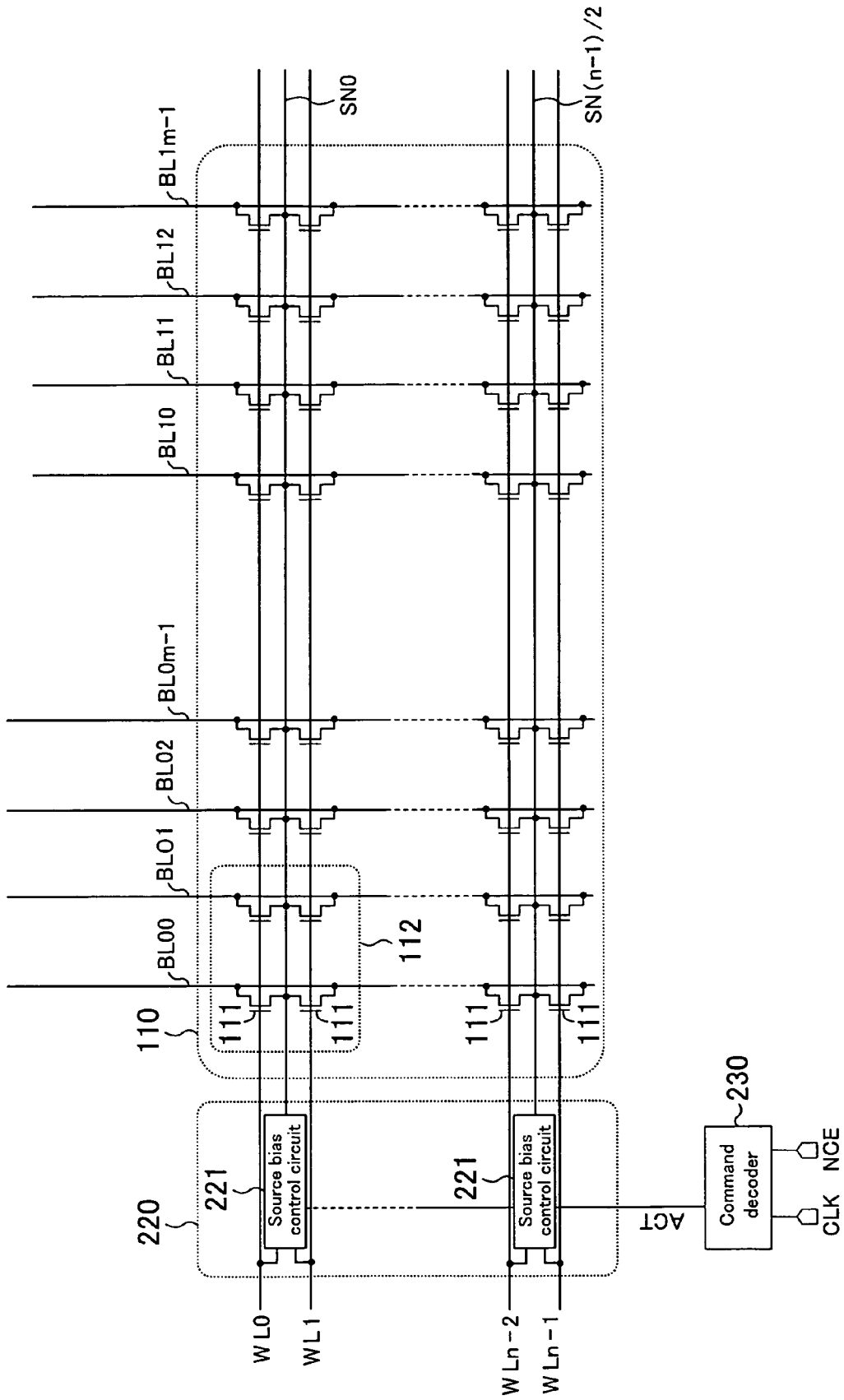
FIG. 8 is a block diagram illustrating a configuration of a semiconductor memory device according to a second embodiment of the present invention.

FIG. 8 is a block diagram illustrating a configuration of a semiconductor memory device 200 according to a second embodiment of the present invention. In this embodiment and modified examples, each component having substantially the same function as that in the first embodiment is identified by the same reference numeral and therefore the description thereof will be omitted.

The semiconductor memory device 200 is different from the semiconductor memory device 100 in that a source bias control circuit array 220 are provided, instead of the source bias control circuit array 120, and furthermore a command decoder 230 is added.

In the source bias control circuit array 220, a plurality of source bias control circuits 221 are provided so as to correspond to source lines, respectively.

Each of the source bias control circuits 221 controls a potential of an associated one of the source lines according to respective potentials of ones of the word lines corresponding to ones of memory cells in two rows and a memory activation signal ACT (which will be later described) output by the command decoder 230. Specifically, each of the source bias control circuits 221 is formed so as to have a configuration shown in FIG. 9.

Figure 9:
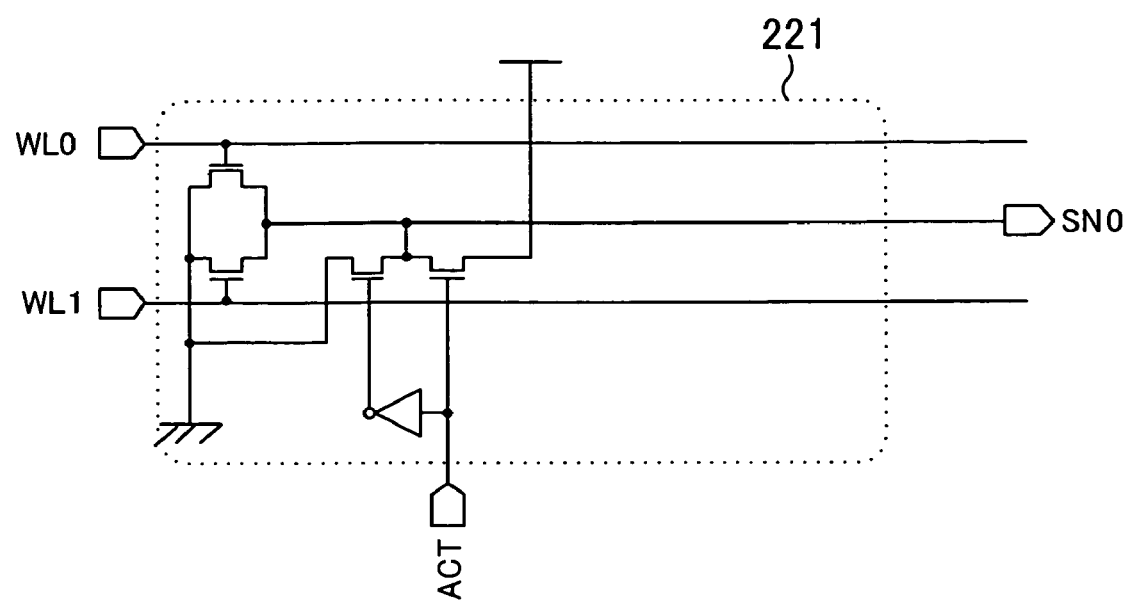
FIG. 9 is a block diagram illustrating a configuration of a source bias control circuit according to the second embodiment of the present invention.

With the source bias control circuits 221 having the configuration of FIG. 9, only when each of the two word lines is the Low level and the memory activation signal ACT is the High level, the source bias potential is supplied to the associated one of the source lines. In other cases, the associated one of the source lines is the VSS level.

Figure 10:
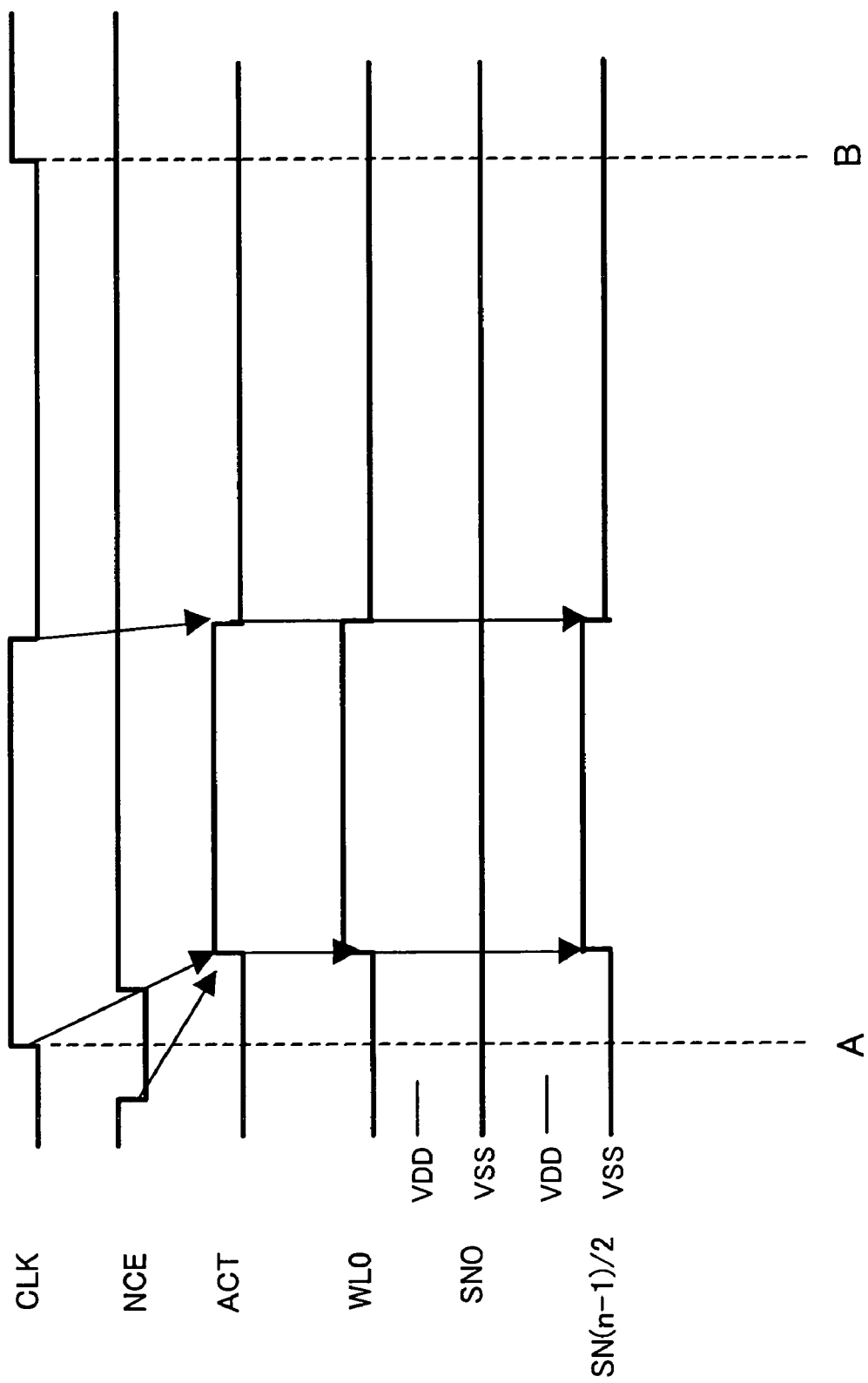
FIG. 10 is a timing chart according to the second embodiment of the present invention.

The command decoder 230 generates the memory activation signal ACT according to an external signal NCE received from the outside of the semiconductor memory device 200 and an external clock which is to be a reference of the operation of the semiconductor memory device 200. Specifically, as shown in FIG. 10, when the external signal NCE falls and the external clock signal CLK rises, the memory activation signal ACT rises and the memory activation signal ACT falls at a falling edge of the external clock signal CLK.

In the semiconductor memory device 200, one of the word lines is selected with a reference to the memory activation signal ACT and the selected word line is activated. For example, assume that the word line WL0 is selected. As shown in FIG. 10, when the memory activation signal ACT rises, the word line WL0 becomes the High level. When the memory activation signal ACT falls, the word line WL0 becomes the Low level.

When the semiconductor memory device 200 is in a stand-by state, all of the source lines are set to be a ground potential (VSS level).

When the semiconductor memory device 200 is in an operation, the memory activation signal ACT of the High level is output from the command decoder 230. Thereafter, with the memory activation signal ACT used as a reference signal, for example, when the word line WL0 is set to be the High level by an address signal received from the outside, the potential of the source line SN0 is kept at the VSS level.

Since the memory activation signal ACT is the High level, the source bias potential is supplied from the internal supply circuit to each of the other source lines than the source line SN0. Thereafter, when the memory activation signal ACT is reset to be the Low level by the command decoder 230, in response to a fall signal, the word line WL0 is reset to the Low level. At the same time, the bias potential is supplied to respective potentials of ones of the source lines and then become the VSS level.

As has been described, according to this embodiment, when the semiconductor memory device 200 is in a stand-by state, all of the source lines are set to be the ground potential. When the semiconductor memory device 200 is in an active state, the source bias potential is supplied to only ones of the source lines connected to ones of the memory cells other than a read-out target memory cell. Therefore, a stationary current due to an OFF leakage current when the semiconductor memory device 200 is in a stand-by state can be reduced.

One of the source lines connected to one of the memory cells which is to be accessed stays at the Low level and has no potential change. Therefore, an access speed is increased.

First Modified Example of Second Embodiment

Figure 11:
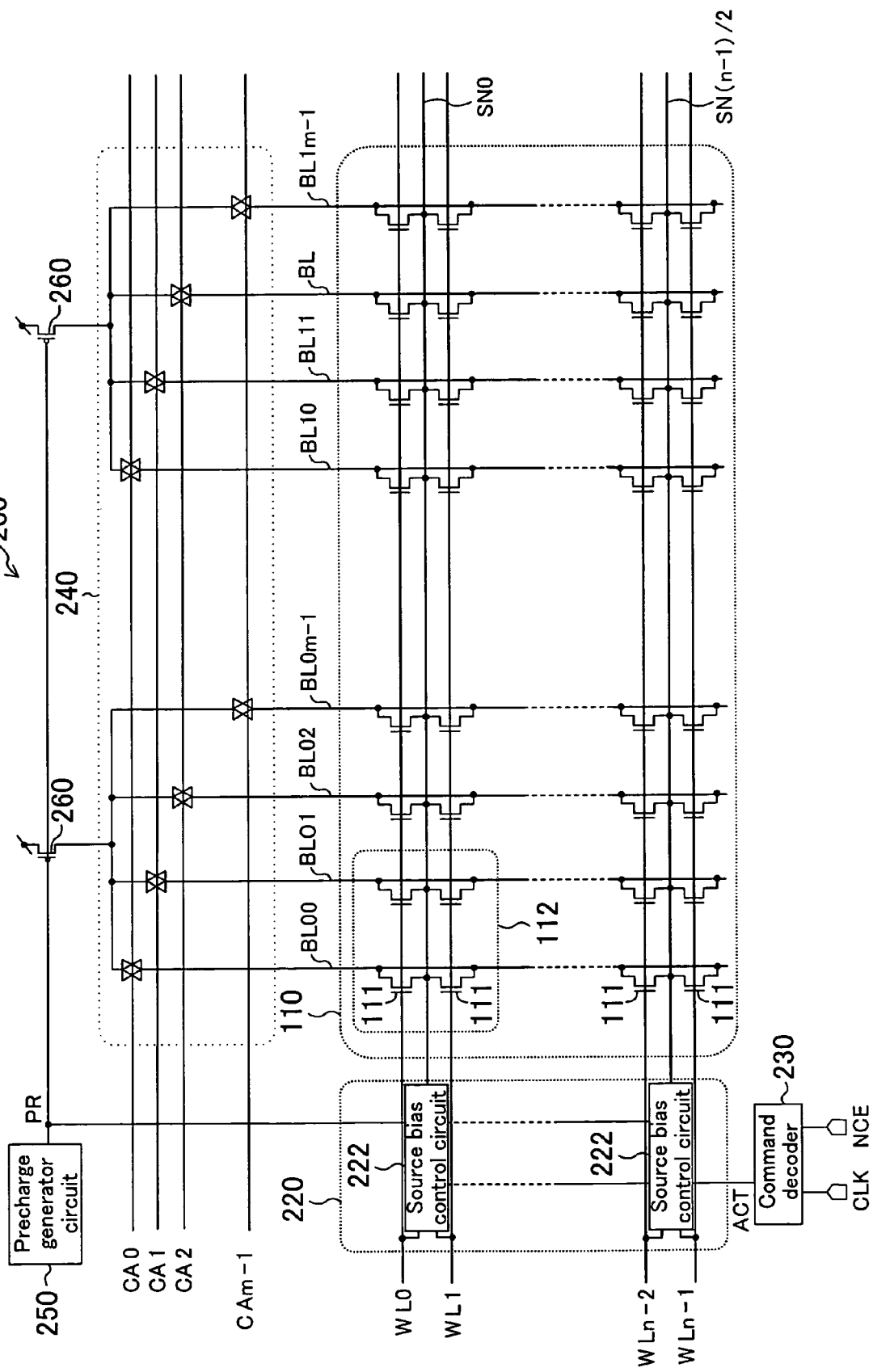
FIG. 11 is a block diagram illustrating a configuration of a semiconductor memory device according to a first modified example of the second embodiment of the present invention.

As shown in FIG. 11, instead of the source bias control circuits 221 of the semiconductor memory device 200, a plurality of source bias control circuits 222 may be provided.

Although not shown in FIG. 1 and FIG. 8, the column decoder 240, a precharge generator circuit 250 and precharge transistors 260 are shown in FIG. 11.

Column selection signals CA0 through CAm−1 indicating which bit line is to be selected are connected to the column decoder 240. In this modified example, normally, all of the column selection signals (CA0 through CAm−1) are the High level (activated state). When a memory cell is accessed, one of the column selection signals corresponding to one or more of the bit lines which are not selected becomes the Low level (deactivated state). The column decoder 240 connects a bit line corresponding to an activated column selection signal to an associated one of the precharge transistors 260.

In response to the memory activation signal ACT, the precharge generator circuit 250 outputs a precharge signal PR for controlling precharge of selected one of the bit lines. Specifically, the precharge generator circuit 250 outputs the precharge signal PR of the Low level for a certain period (a period necessary for precharging the selected one of the bit lines) at a timing when the memory activation signal ACT rises to be the High level and sets the precharge signal PR back to the High level by itself. As for the precharge signal PR, the state of being the Low level is also referred to as being "activated" and the state of being the High level is also referred to as being "reset" or being "deactivated".

The precharge signal PR output from the precharge generator circuit 250 is received by a gate terminal of the precharge transistor 260 (p-channel transistor). Thus, when the precharge signal PR is the Low level, one of the bit lines connected to the precharge transistor 260 through the column decoder 240 is precharged.

Figure 12:
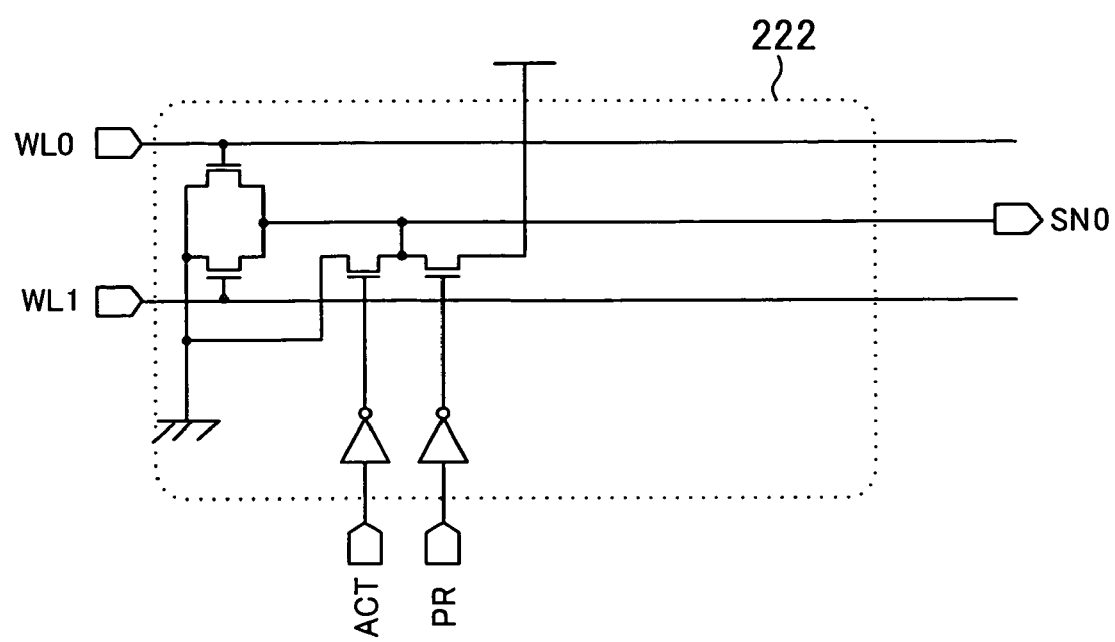
FIG. 12 is a block diagram illustrating a configuration of a source bias control circuit according to the first modified example of the second embodiment of the present invention.

The source bias control circuit 222 controls a potential of one of the source lines according to the memory activation signal ACT and the precharge signal PR. Specifically, the source bias control circuit 222 has a configuration shown in FIG. 12.

Figure 13:
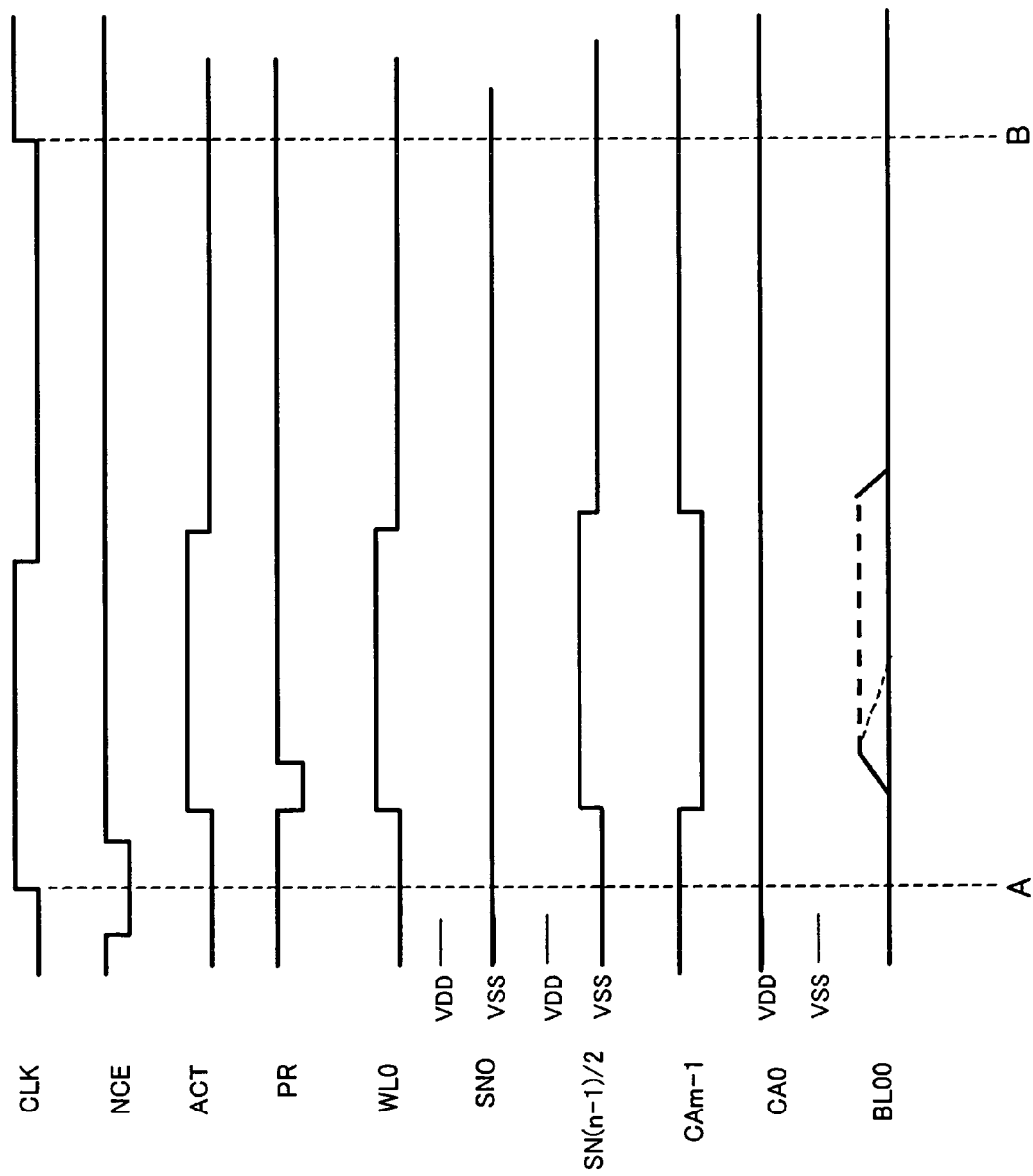
FIG. 13 is a timing chart according to the first modified example of the second embodiment of the present invention.

The operation of the semiconductor memory device according to the first modified example of the second embodiment, which has the above-described configuration, when one of memory cells connected to the word line WL0 and the bit line BL00 is read out will be described with reference to a timing chart shown in FIG. 13.

In a stand-by state before the time A, respective potentials of all of the source lines are kept at the VSS level. When an external signal NCE rises at the time A, a memory activation signal ACT of the High level is output from the command decoder 230. With use of the memory activation signal ACT as a reference signal, each of the word line WL0 and a column selection signal CA0 is turned to the High level by an address signal received from the outside.

When the memory activation signal ACT is turned to the High level, a precharge signal PR of the Low level is output from the precharge generator circuit 250. Accordingly, the precharge transistor 260 is turned ON for a necessary amount of time for precharging the selected bit line BL00, so that the bit line BL00 is precharged.

When the precharge signal PR is turned to the Low level, the source line SN0 is kept at the VSS by the source bias control circuit 222 because the word line WL0 is the High level. In this case, the source bias potential is supplied to the other ones of the source lines than the source line SN0. Then, when the precharge signal PR is reset to be the High level and precharge of the bit line BL00 is completed, data ("0" or "1") of selected one of the memory cells is output to the outside through the bit line BL00.

Thereafter, when the memory activation signal ACT is reset to be the Low level, in response to a fall signal, each of the selected word line WL0 and the column selection signal CAm−1 is reset to be the High level. At the same time, the source lines to which charges are supplied become the VSS level and thus are returned to be in a stand-by state.

In this manner, according to this modified example, the potential of one of the source lines is controlled as selected one of the bit lines is precharged. Thus, an OFF leakage current flowing between one of the bit lines and an associated one of the source lines with an associated one of the memory cells can be reduced.

Moreover, by performing precharge of selected one of the bit lines and data read by the activation of the word line WL0 at the same time, an access time can be increased to a high speed. Specifically, for example, in the case of reading data of "1", a time when precharge of selected one of the bit lines is completed is a read out time for the data of "1". Accordingly, a precharge time can be virtually hidden. When data of "0" is read out, precharge of selected one of the bit lines is not necessary. Therefore, if the capability of supplying VSS to a source line (speed at which a potential is reduced to the VSS level) is set to be sufficiently larger than the capability of precharging a bit line (speed at which precharge is performed), read out of data "0" can be performed at an increased speed. That is, if the capability of precharging a bit line and the capability of supplying VSS to a source line are optimized, read out at an increased speed can be performed.

In this modified example, a precharge time for a bit line is less than a rise time of the memory activation signal ACT. However, the precharge time may be the same amount of time as the rise time of the memory activation signal ACT.

In the semiconductor memory device of this modified example, selected one of the source lines is activated by the bit line precharge signal PR. However, even if the semiconductor memory device is so configured that selected one of the bit lines is activated by the memory activation signal ACT, the same effects can be achieved.

For the column decoder 240, an example in which all of the column selection signals are normally activated (normally ON state) has been described. However, the semiconductor memory device may be so configured that all of the column selection signals are normally deactivated (normally OFF state) and only one of the column selection signals corresponding to one of the bit lines which is to be selected is activated when a memory cell is accessed.

Second Modified Example of Second Embodiment

Figure 14:
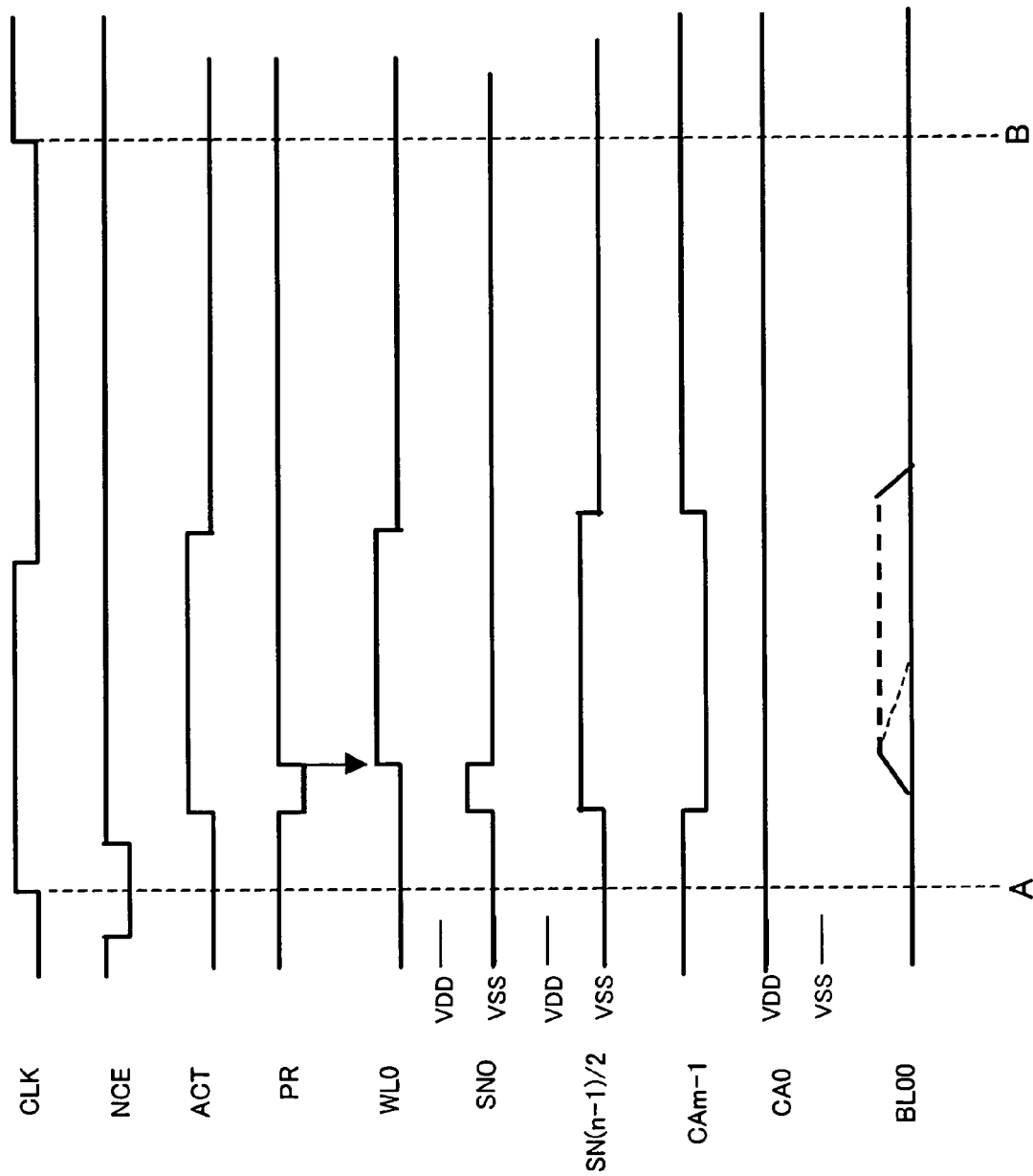
FIG. 14 is a timing chart according to a second modified example of the second embodiment of the present invention.

In the semiconductor memory device according to the first modified example of the second embodiment, word lines may be controlled so as not to be activated during a precharge period (a period in which a precharge signal PR is in the Low level). FIG. 14 is a timing chart illustrating the case where one of the memory cells is connected to a word line WL0 and a bit line BL00 is read out and the word lines are controlled so as not to be activated during a precharge period.

As shown in FIG. 14, when a read out operation is started and a memory activation signal ACT rises, the precharge signal PR is turned to the Low level during a predetermined time period and is reset by the precharge generator circuit 250 itself. Thus, selected one of bit lines (a bit line BL00 in this case) is precharged. During a period in which the bit line BL00 is precharged, a source bias potential is supplied to all of source lines including a source line SN0.

When the precharge signal PR is reset, only the selected source line SN0 is kept at the VSS level and the source bias potential is supplied to all of the other ones of the source lines.

Also, when the precharge signal PR is reset, the word line WL0 is activated and data is read out from one of the memory cells connected to the word line WL0 and the bit line BL00.

Then, when the memory activation signal ACT is reset, in response to a fall signal, each of the word line WL0 and the column selection signal CA0 is reset. At the same time, the source lines to which the source bias potential is supplied become the VSS level to be returned to a stand-by state.

Thus, by activating one of the word lines after precharge of one of the bit lines is completed, an error in an operation of reading out of one of the memory cells due to noise generated by a precharge operation can be prevented.

By performing precharge for selected one of the bit lines and supply of the source bias potential to one of the source lines at the same time, a through current in one of the memory cells can be sufficiently reduced. That is, a more stable data read operation can be achieved.

Moreover, circuit design aiming optimization of the capability of precharging a bit line and the capability of supplying VSS for each source line is unnecessary. That is, a circuit which has strong resistance against variation can be achieved.

Third Example of Second Embodiment

Figure 15:
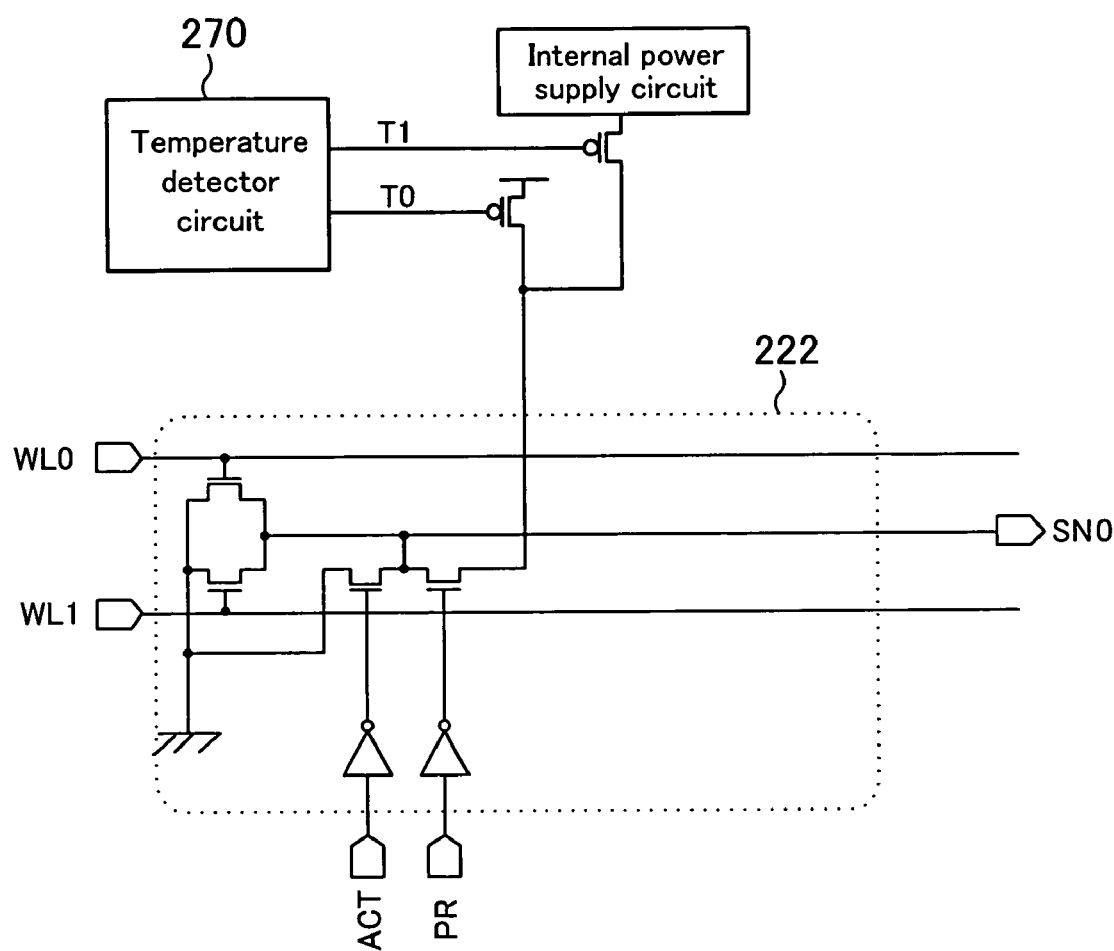
FIG. 15 is a block diagram illustrating a source bias control circuit according to a third modified example of the second embodiment of the present invention.

The source bias potential may be set to be changed according to a temperature of a semiconductor memory device. FIG. 15 illustrates an exemplary circuit in which the source bias potential is changed according to a temperature.

In this example, which one of a potential generated by a internal power supply circuit and VDD-Vtp (Vtp: threshold potential of a p-channel transistor) is supplied to a source bias control circuit 222 is determined according to a temperature of the semiconductor memory device detected by a temperature detector circuit 270.

According to the temperature of the semiconductor memory device, the temperature detector circuit 270 activates a temperature detection signal T0 or T1 and then outputs the activated detection signal. Specifically, for example, at a high temperature of 100° C. or more at which a large OFF leakage current is generated, the temperature detection signal T0 is activated. At room temperature or a low temperature of 0° C. or less, for example, the temperature detection signal T1 is activated.

Thus, at room temperature or a low temperature of 0° C. or less, a potential generated by the internal power supply circuit is supplied to one of the source lines via the source bias control circuit 222. At a high temperature of 100° C. or more, for example, VDD-Vtp is supplied to one of the source lines via the source bias control circuit 222.

That is, according to this modified example, under a temperature condition where a larger OFF leakage current is generated, the source bias potential is controlled to be a high level, while under a temperature condition where a relatively small OFF leakage current is generated, the source bias potential is controlled to be a low level. Accordingly, power consumption for potential control of the source lines can be minimized according to a temperature.

Fourth Example of Second Embodiment

In each of the above-described embodiments and examples, the source bias potential and the precharge potential of selected one of the bit lines are different. However, by setting respective potentials of selected one of the source lines and an associated one of the bit lines to be the same level, an OFF leakage current in ones of the memory cells located in different rows from a row in which a read-out target memory cell exists can be completely eliminated.

Figure 16:
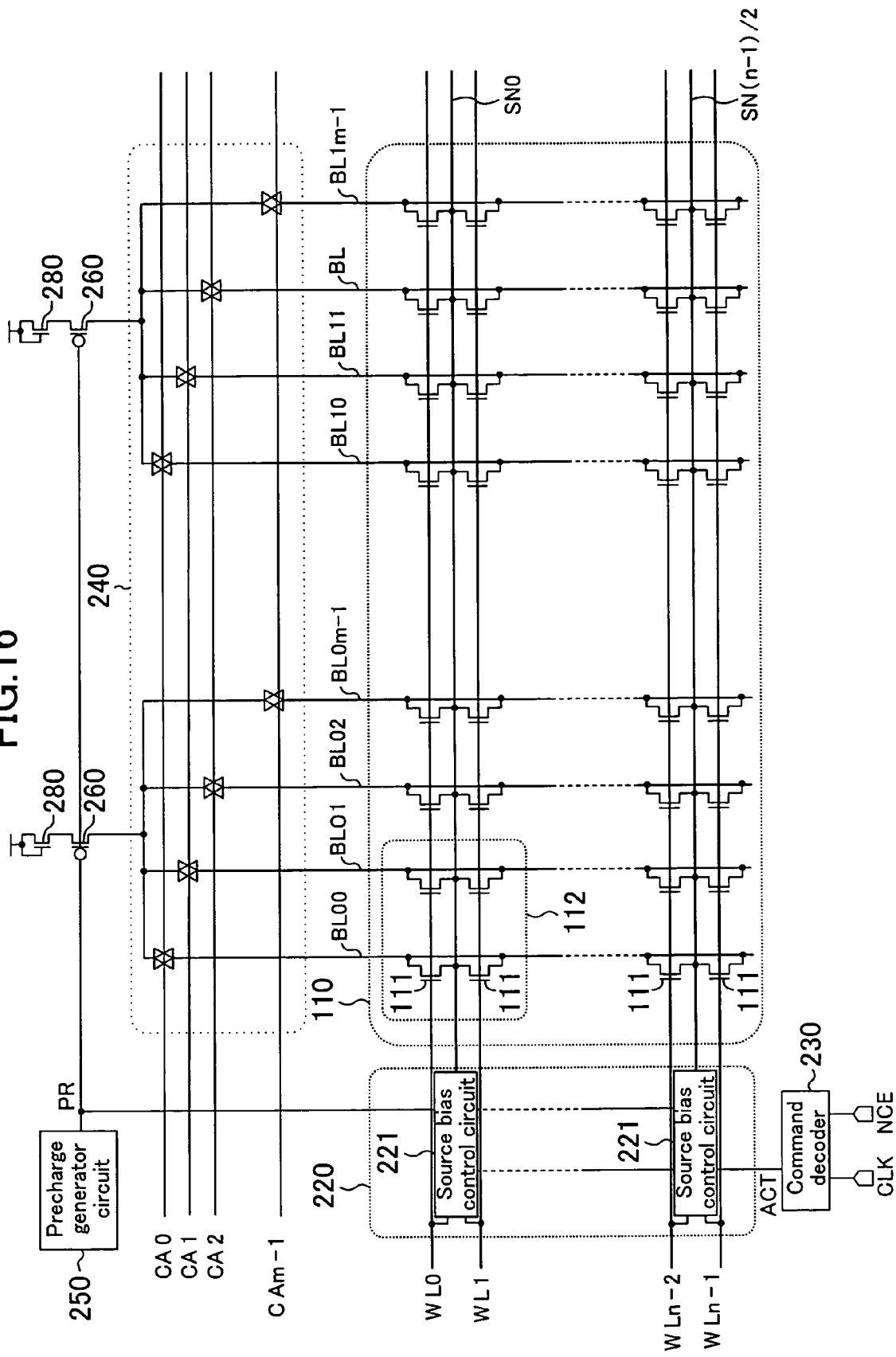
FIG. 16 is a block diagram illustrating a semiconductor memory device according to a fourth modified example of the second embodiment of the present invention.

For example, FIG. 16 is a block diagram illustrating an exemplary semiconductor memory device in which an n-channel transistor 280 is connected to a drain terminal of a precharge transistor 260 and a potential of selected one of the bit lines. In the semiconductor memory device of this modified example, an internal power supply circuit outputs VDD-Vtn to a source bias control circuit 221. Thus, respective potentials of selected one of source lines and an associated one of bit lines can be set to be the same level.

A level that the respective potentials of selected one of the source lines and an associated one of the bit lines are set to be is not limited to VDD-Vtn. The level may be set in consideration of the balance between increase in power consumption due to supply of a potential to selected one of the source lines and reduction in power consumption due to prevention of an OFF leakage. When the respective potentials of selected one of the source lines and an associated one of the bit lines may be set to be VDD-Vtn, increase in circuit size is small, compared to the case where the respective potentials of selected one of the source lines and an associated one of the bit lines are set to be some other potential.

Even when this modified example is applied to the semiconductor memory device of the first embodiment, the same effects can be achieved.

Third Embodiment

Figure 17:
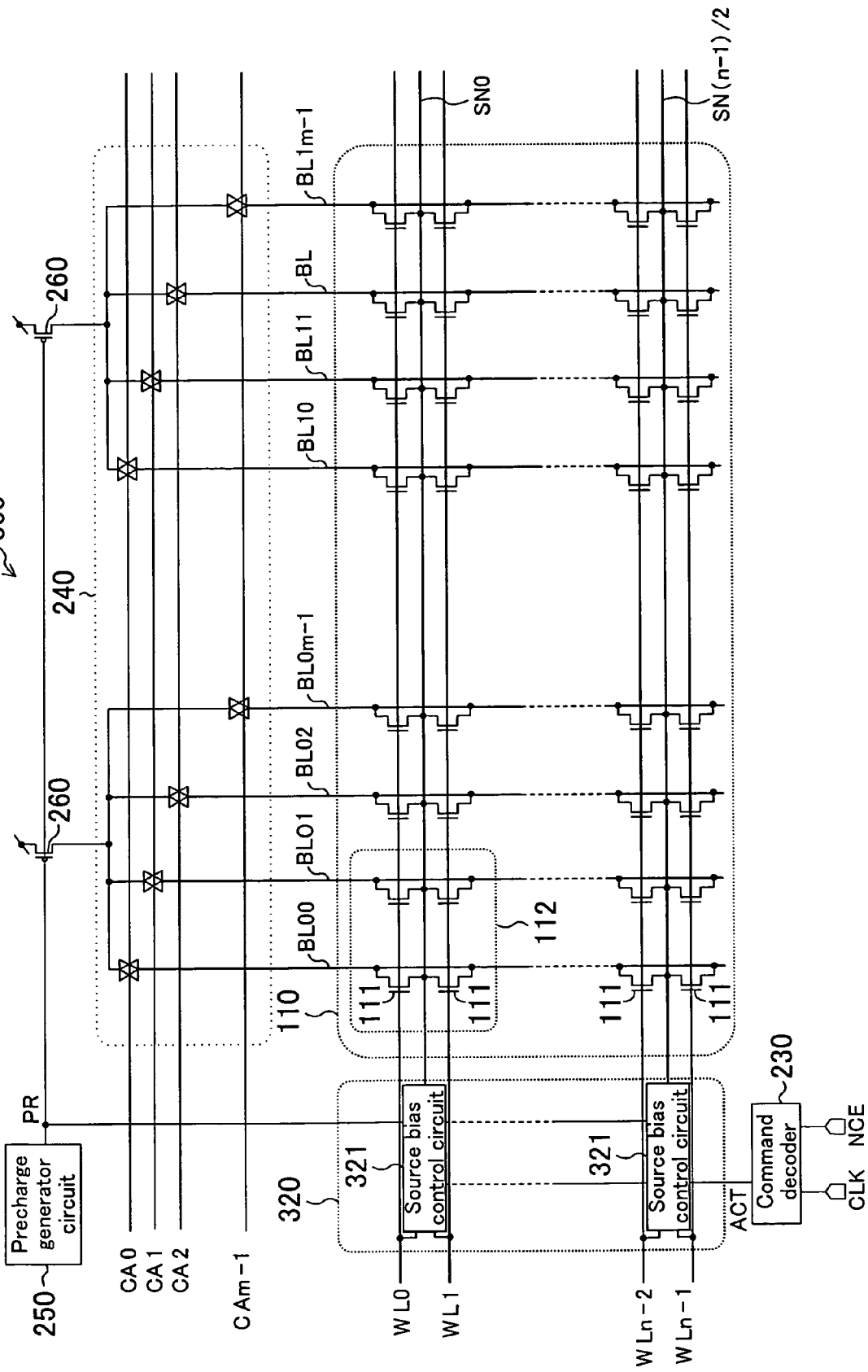
FIG. 17 is a block diagram illustrating a configuration of a semiconductor memory device according to a third embodiment of the present invention.

FIG. 17 is a block diagram illustrating a semiconductor memory device 300 according to a third embodiment of the present invention. The semiconductor memory device 300 includes a source bias control circuit array 320, instead of the source bias control circuit array 220 of the semiconductor memory device 200.

In the source bias control circuit array 320, a plurality of source bias control circuits 321 are provided so as to correspond to source lines, respectively.

Figure 18:
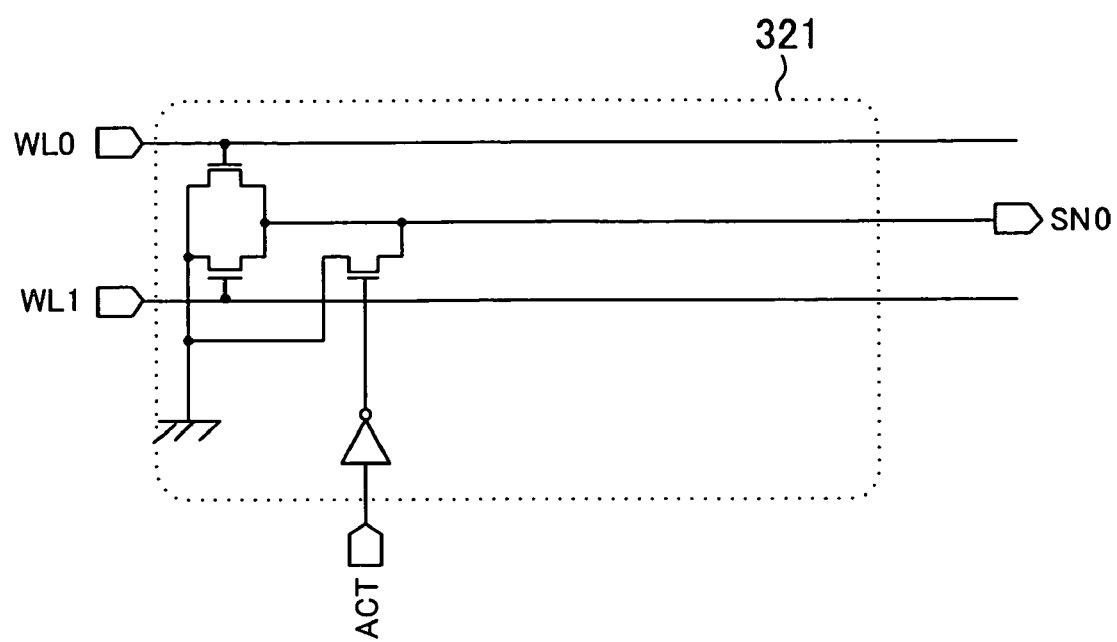
FIG. 18 is a block diagram illustrating a configuration of a source bias control circuit according to the third embodiment of the present invention.

Specifically, each of the source bias control circuits 321 is formed so as to have a configuration shown in FIG. 18. In each of the source bias control circuits 321, when respective levels of word lines connected thereto and a level of a memory activation signal ACT are the Low level, an associated one of the source lines becomes a high impedance (Hi-Z) state.

Figure 19:
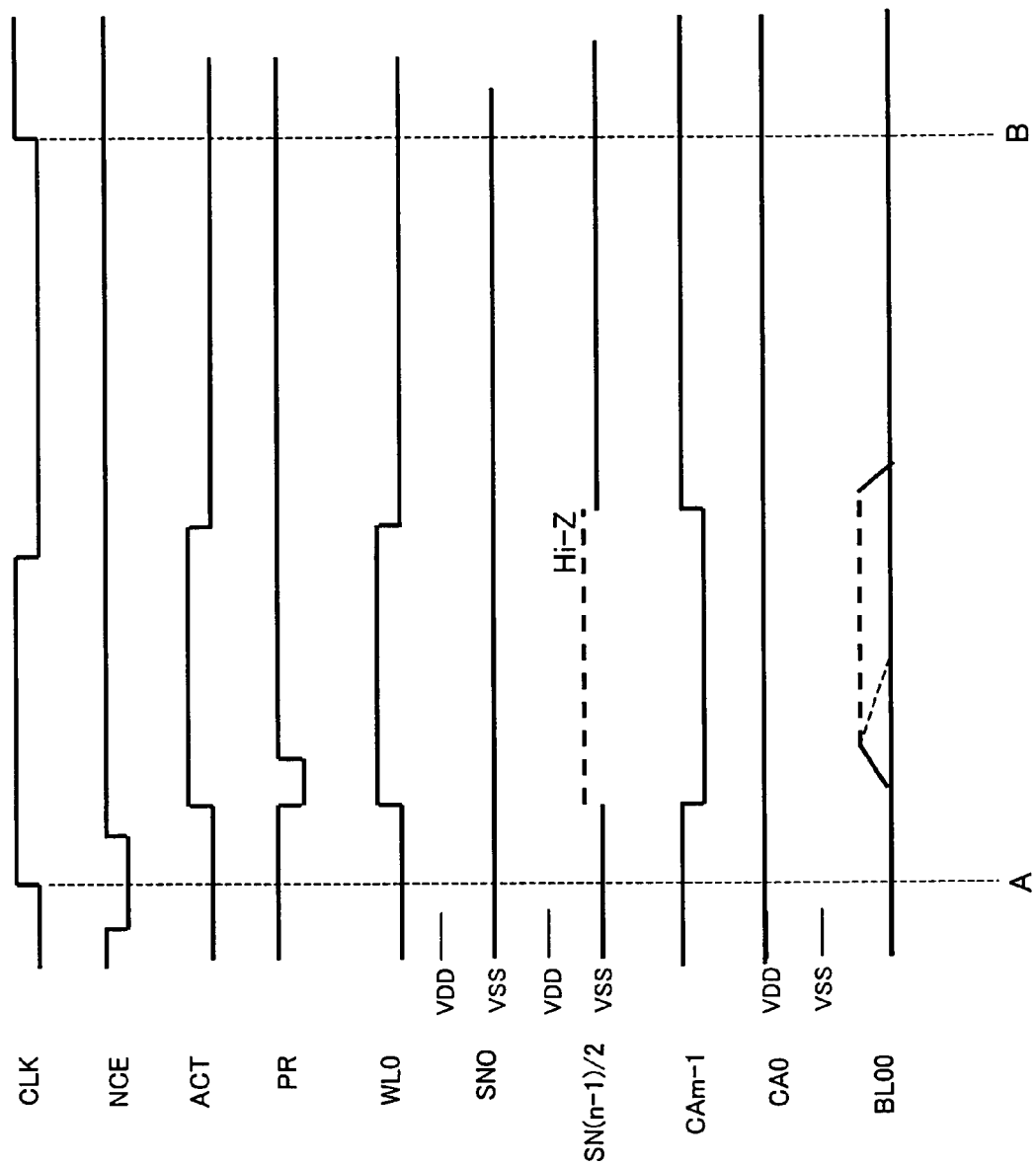
FIG. 19 is a timing chart according to the third embodiment of the present invention.

In the semiconductor memory device 300 having the above-described configuration, as shown in FIG. 19, in a stand-by state before a time A, all of the source lines are kept at the VSS level. Next, when the memory activation signal ACT is activated, only selected one of the source lines (for example, source line SN0) is kept at the VSS level and all of the other ones of the source lines become a Hi-Z state. Then, when data is read out from an associated one of memory cells and then the memory activation signal ACT is reset, in response of a fall signal, selected one of the word lines (for example, word line WL0) is reset. At the same time, the source lines in a Hi-Z state are turned to be the VSS level.

Thus, according to this embodiment, when the semiconductor memory device 300 is in a stand-by state, all of the source lines are set to be a ground potential, and a stationary current generated due to an OFF leakage current flowing in a stand-by time in the known technique can be eliminated. Moreover, when the semiconductor memory device 300 is in an active state, one or more of the source lines which are not connected to one of the memory cells which is to be read out are turned to be in a Hi-Z state. Therefore, power consumption during an active period can be reduced.

Also, compared to the case where one or more of the source lines which are not connected to one of the memory cells which is to be read out are intentionally set to be a ground potential, an OFF leakage current can be also reduced by setting those unconnected source lines to be in a Hi-Z state.

Modified Example of Third Embodiment

Figure 20:
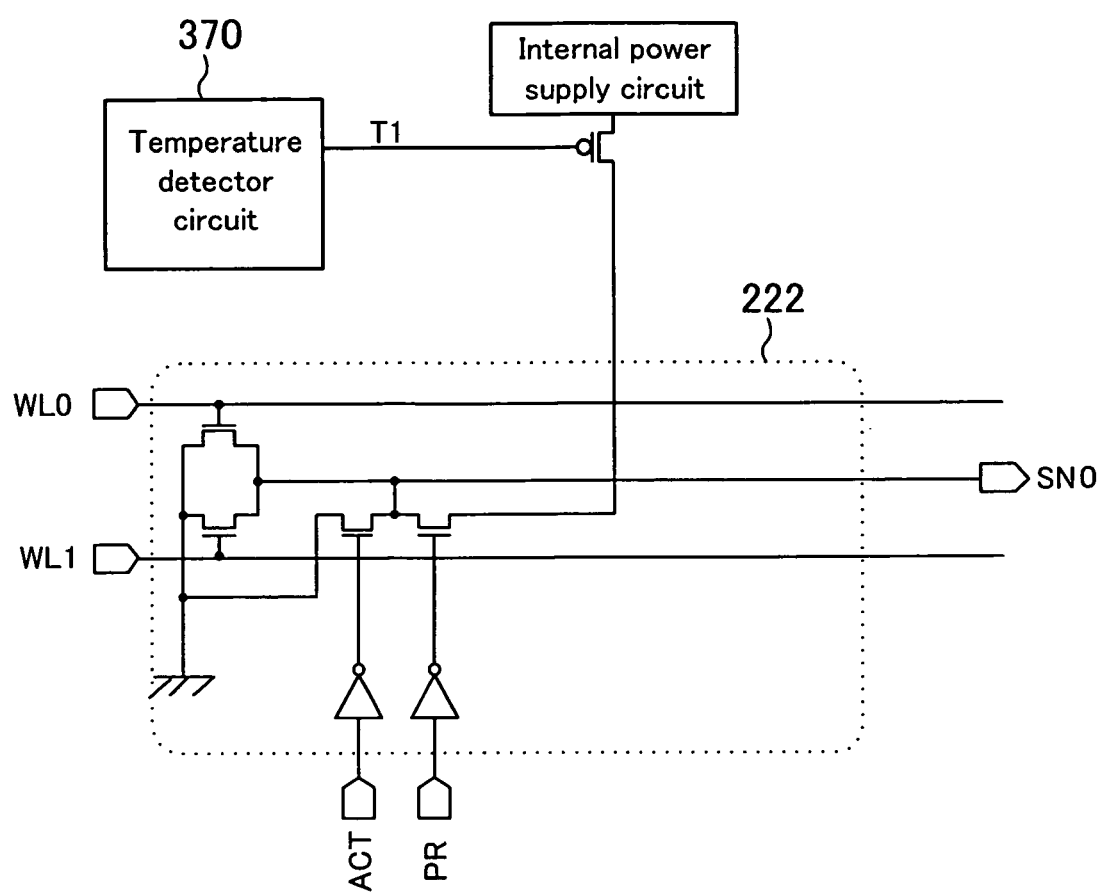
FIG. 20 is a block diagram illustrating a configuration of a source bias control circuit according to a modified example of the third embodiment of the present invention.

In the semiconductor memory device of the third embodiment, for example, as shown in FIG. 20, the source bias control circuits 222 may be used, instead of the source bias control circuits 321 and, furthermore, a temperature detector circuit 370 may be provided. This modified example is an example in which a potential generated by an internal power supply circuit can be switched between a state where the potential is supplied and a Hi-Z state according to a temperature of the semiconductor memory device detected by the temperature detector circuit 370.

The temperature detector circuit 370 is configured so that when a temperature of the semiconductor memory device exceeds a predetermined temperature, the temperature detector circuit 370 activates a temperature detection signal T1 and outputs the activated temperature detection signal T1. Specifically, at a high temperature of, for example, 100° C. or more at which a large OFF leakage current is generated, the temperature detection signal T1 is activated.

With the temperature detector circuit 370 having the above-described configuration, while a precharge signal PR is activated, one or more of the source lines which are not connected to one of memory cells which is to be read are controlled to be in a Hi-Z state or a state where an internal power supply voltage is supplied. Thus, a semiconductor memory device in which power consumption during an active period is suppressed and which has a property margin can be provided.

In the example shown in FIG. 20, voltage states of those unconnected source lines are set to be either one of two voltage states, i.e., a state where a potential of an internal power supply circuit is supplied and a Hi-Z state. However, the source bias voltage may be minutely controlled according to a temperature.

Fourth Embodiment

Figure 21:
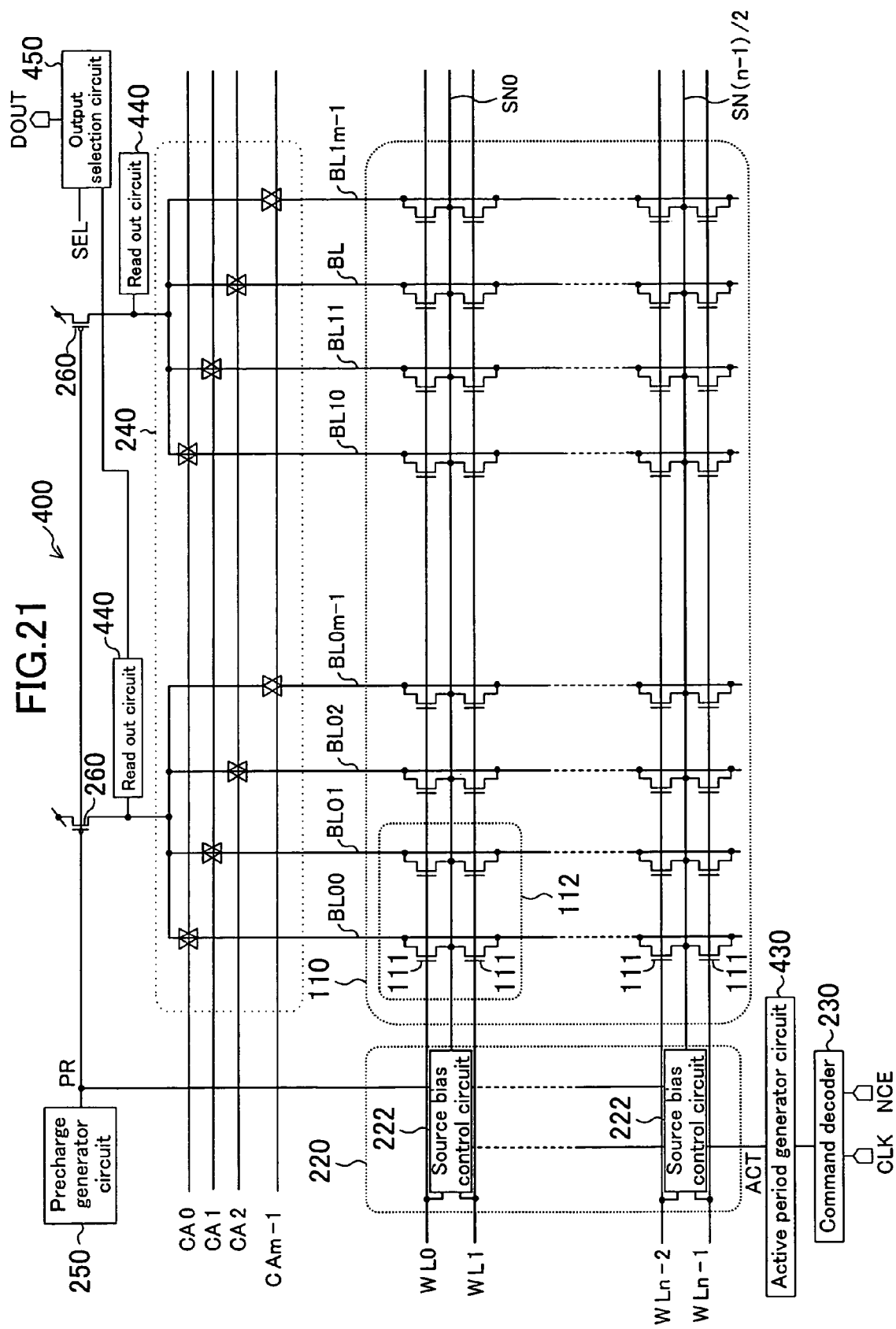
FIG. 21 is a block diagram illustrating a configuration of a semiconductor memory device according to a fourth embodiment of the present invention.

FIG. 21 is a block diagram illustrating a semiconductor memory device 400 according to a fourth embodiment of the present invention. The semiconductor memory device 400 is obtained by adding an active period generator circuit 430 to the semiconductor memory device of the first example of the second embodiment. Although not described in each of the first through third embodiments, a read out circuit 440 and an output selection circuit 450 which are of a configuration for reading out data from a memory cell.

The active period generator circuit 430 controls a fall timing of a memory activation signal ACT generated by the command decoder 230. In the semiconductor memory device of the second embodiment or the like, based on the external clock signal CLK, the fall timing of the memory activation signal ACT is controlled. However, in the semiconductor memory device 400, the fall timing of the memory activation signal ACT is controlled according to an internal timing (by the semiconductor memory device 400 itself).

The read out circuit 440 reads out data output to one of bit lines selected by the column decoder 240 and outputs the read out data to the output selection circuit 450.

The output selection circuit 450 receives an output selection signal SEL. The output selection signal SEL is a signal which rises at a fall timing of the memory activation signal ACT. The output selection circuit 450 outputs an output of the read out circuit 440 to the outside of the semiconductor memory device 400 at a timing when the output selection signal SEL rises. That is, a data output is an undefined state while the output selection signal SEL is the Low level.

Figure 22:
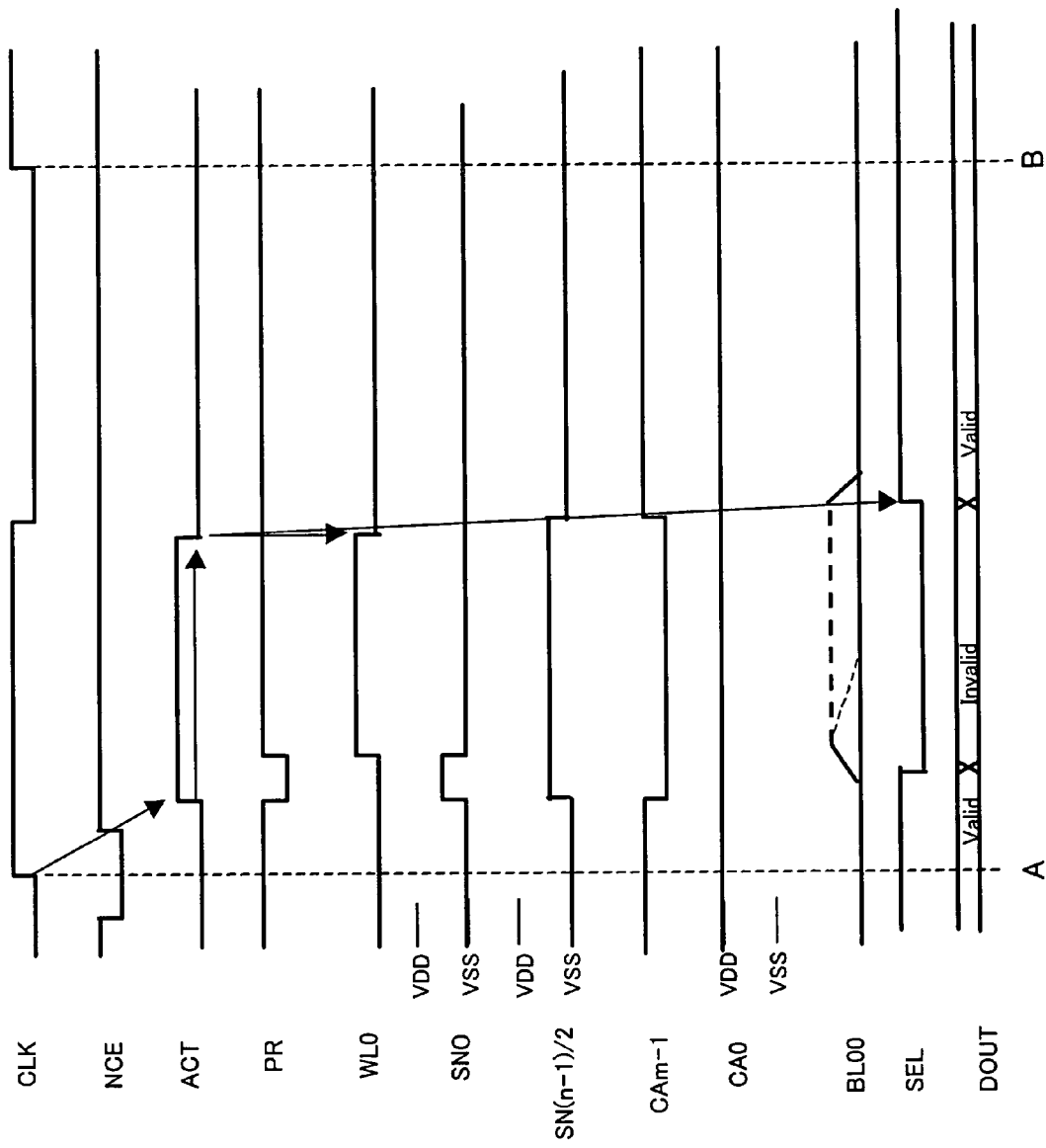
FIG. 22 is a timing chart according to the fourth embodiment of the present invention.

In the semiconductor memory device 400 having the above-described configuration, as shown in FIG. 22, supply of the source bias potential to one or more of the source lines which are not connected to one of the memory cells which is to be read out is completed at the fall timing of the memory activation signal ACT. Thus, a period in which the source bias potential is supplied to one or more of the source lines which are not connected to the read-out target cell can be minimized. If the period in which the source bias potential is supplied to one or more of the source lines which are not connected to the read-out target cell can be minimized, even in the case where the source bias potential is supplied, thereby causing a leakage current from some other path than the memory cells, power consumption due to such leakage current can be minimized.

For example, the fall timing of the memory activation signal ACT is set to match a start timing of an operation at a predetermined maximum operation frequency. Thus, power consumption during an active period can be sufficiently reduced.

Moreover, a timing of data read is controlled according to the fall timing of the memory activation signal ACT. Thus, regardless of a frequency of an external clock signal, a constant access time can be achieved.

First Modified Example of Fourth Embodiment

Figure 23:
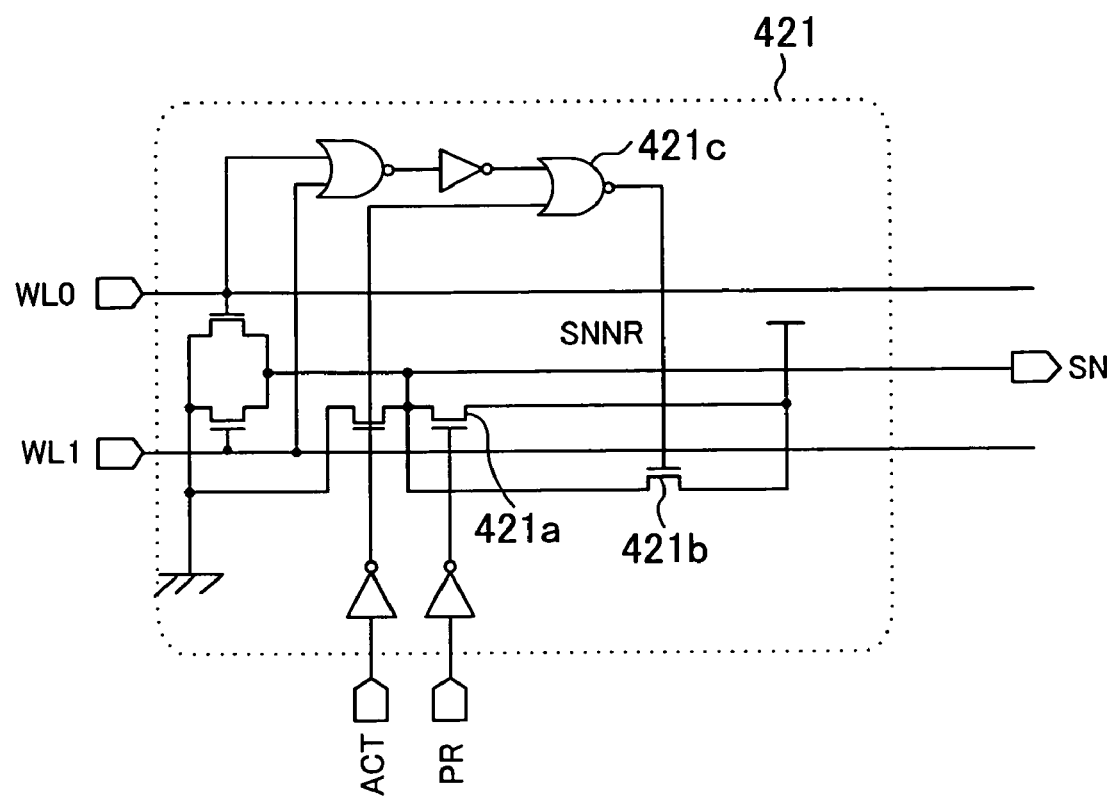
FIG. 23 is a block diagram illustrating a configuration of a source bias control circuit according to a first modified example of the fourth embodiment of the present invention.

FIG. 23 is a block diagram illustrating a source bias control circuit 421 according to a first modified example of the source bias control circuit in the semiconductor memory device of the fourth embodiment of the present invention.

The source bias control circuit 421 is an example of a source bias control circuit capable of switching a source line bias capability (i.e., capability of supplying charges to a source line(s)) among a plurality of levels during an active period. In the source bias control circuit 421, whether the source bias potential is supplied or not is changed by n-channel transistors 421a and 421b. In this example, the n-channel transistors 421a and 421b are formed to have different sizes from each other and thus have different potential supply capabilities from each other.

The operation of the source bias control circuit 421 when a memory cell connected to a word line WL0 and a bit line BL00 is read out will be described with reference to FIG. 24.

Figure 24:
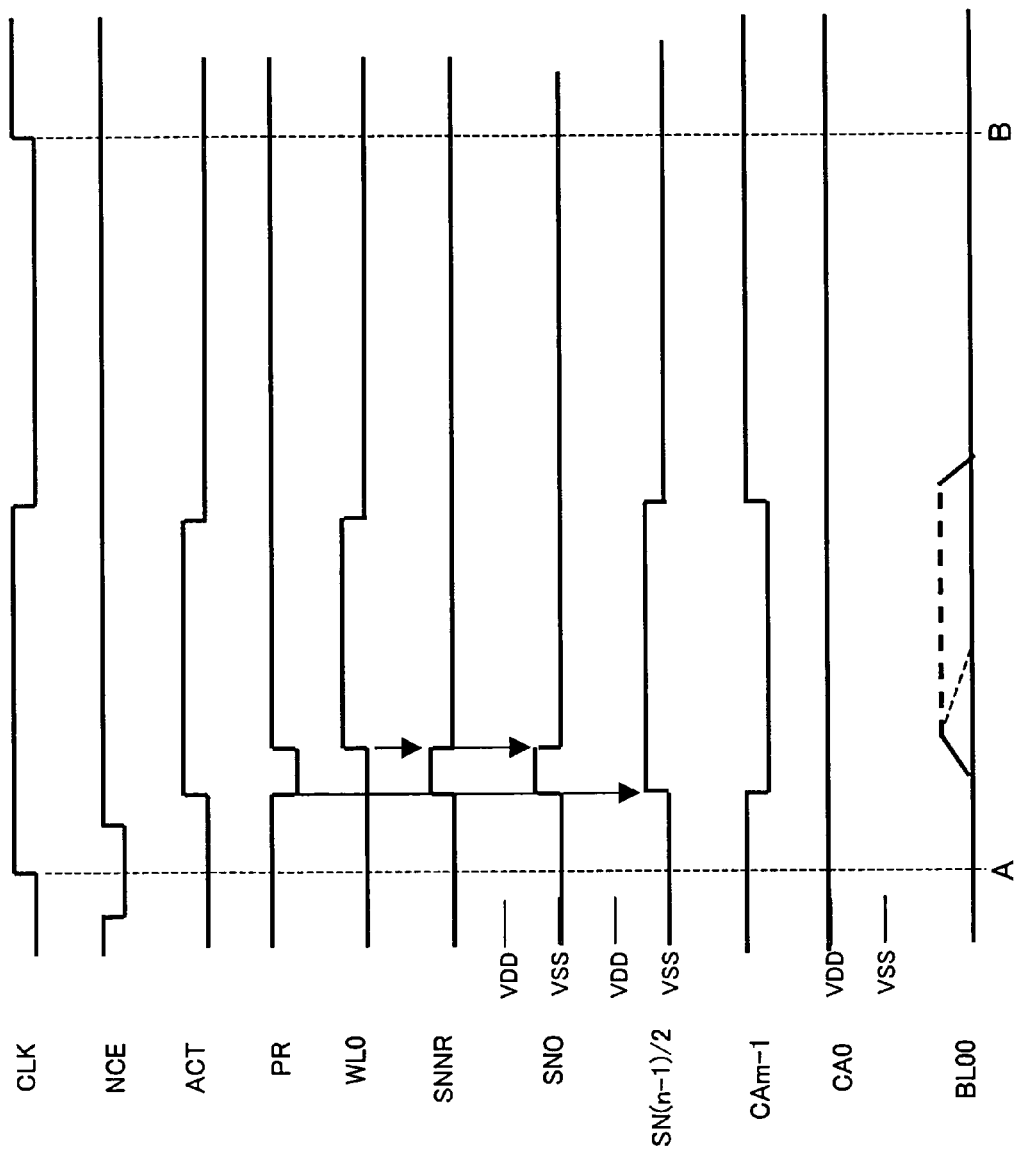
FIG. 24 is a timing chart according to the first modified example of the fourth embodiment of the present invention.

In the source bias control circuit 421, for example, as shown in FIG. 24, when the precharge signal PR is activated, the n-channel transistors 421a and 421b are first turned ON. Thus, the source bias potential is supplied to a source line SN0 via the n-channel transistors 421a and 421b.

Next, when an activation period of a precharge signal PR is completed and the word line WL0 is activated, the n-channel transistor 421a is turned OFF. Also, an output signal SNNR of an OR circuit 421c becomes the Low level. Accordingly, the n-channel transistor 421b is turned OFF. When the n-channel transistors 421a and 421b are turned OFF, the potential of the source line SN0 becomes the VSS level.

In the source bias control circuit 421 connected to one or more of the source lines (other source lines than the source line SN0) which are not connected to one of the memory cells which is to be read out, the precharge signal PR becomes the Low level, the n-channel transistors 421a and 421b are turned ON. Accordingly, the source bias potential is supplied to the other ones of the source lines than the source line SN0 via the n-channel transistors 421a and 421b. When the precharge period is completed and the precharge signal PR becomes the High level, the n-channel transistor 421a is turned OFF. In this case, however, no word line is selected and thus the output signal SNNR is kept at the High level. Accordingly, the n-channel transistor 421a remains ON. Thus, the source bias potential is supplied to one or more of the source lines which are not connected to the read-out target memory cell via the n-channel transistor 421b.

As has been described, according to this modified example, the source bias potential supply capability is increased at a start time of an active period so that the potentials of the associated one of the source lines is increased as quickly as possible. Thus, an access time can be shortened. After each of the potentials of one or more of the source lines which are not connected to one of the memory cells which is to be read out have been increased to the source bias potential, the source bias potential can be supplied with reduced bias capability, for example, so that a small current enough for compensating an OFF leakage current flowing though transistors connected to the associated one of the source lines is supplied. Therefore, power consumption can be reduced.

The number of bias capability levels is not limited to two. Unlike in the manner described above, the number of bias capability levels may be optimally changed, for example, according to characteristics of a memory.

The level of the bias capability may be changed in a different manner. For example, a temperature detector circuit for detecting change in temperature of a semiconductor memory device may be provided and the level of the bias capability may be changed according to change in temperature of the semiconductor memory device detected by the temperature detector circuit.

Second Modified Example of Fourth Embodiment

Figure 25:
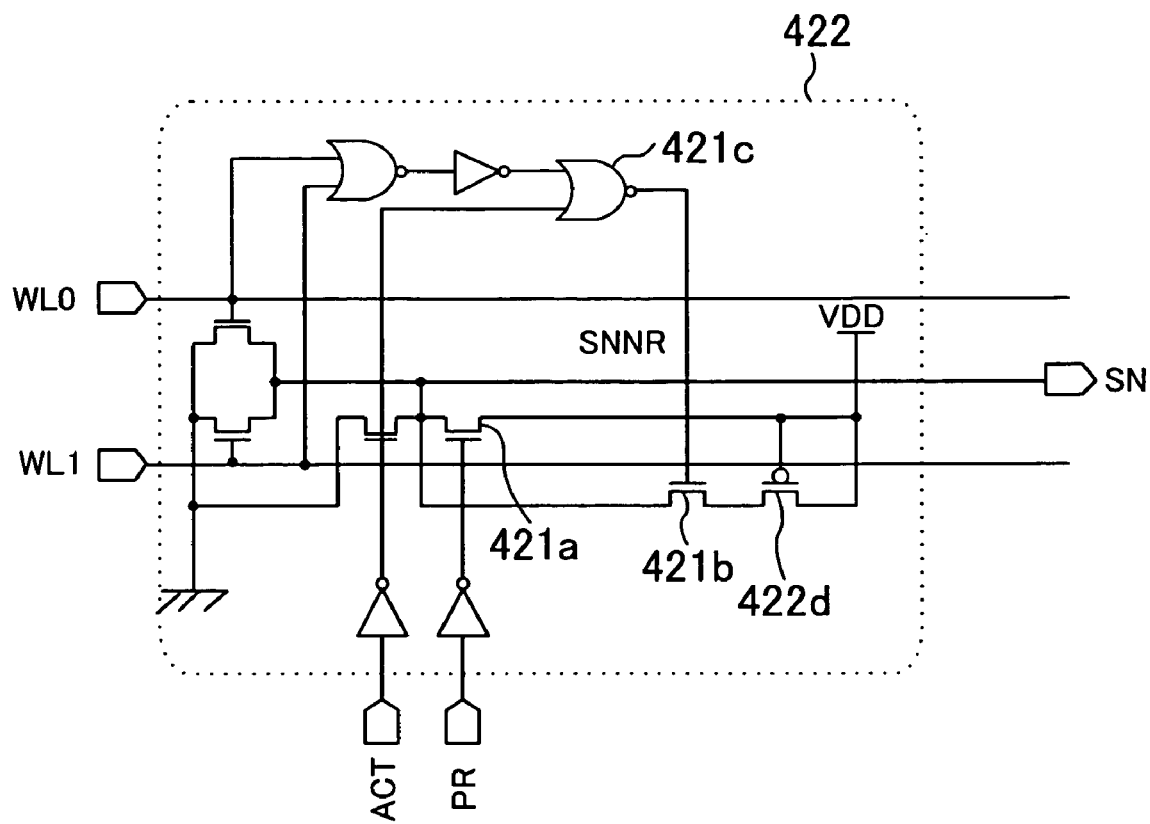
FIG. 25 is a block diagram illustrating a configuration of a source bias control circuit according to a second modified example of the fourth embodiment of the present invention.

FIG. 25 is a block diagram illustrating a source bias control circuit 422 according to a second modified example of a source bias control circuit in the semiconductor memory device of the fourth embodiment of the present invention.

The source bias control circuit 422 is an example of a source bias control circuit for supplying the source bias potential to one or more of source lines which are not connected to one of memory cells which is to be read out only at an initial time point in an active period.

The source bias control circuit 422 is obtained by adding a p-channel transistor 422d to the source bias control circuit 421. The p-channel transistor 422d is configured so that a potential of the VDD level is supplied to a gate terminal, thereby making one or more of the source lines which are not connected to the read-out target memory cell be in a Hi-Z state.

Figure 26:
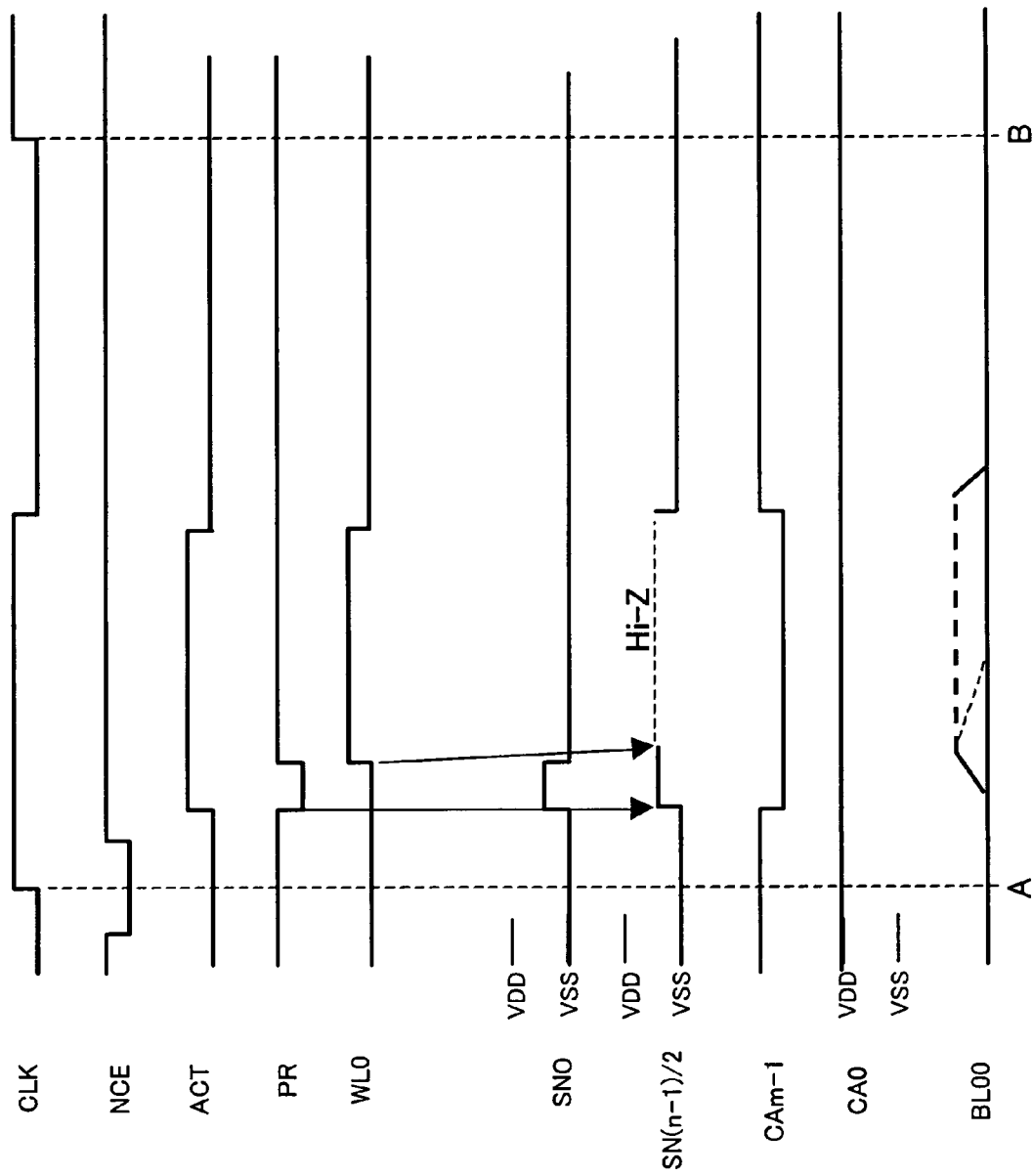
FIG. 26 is a timing chart according to the second modified example of the fourth embodiment of the present invention.
Figure 27:
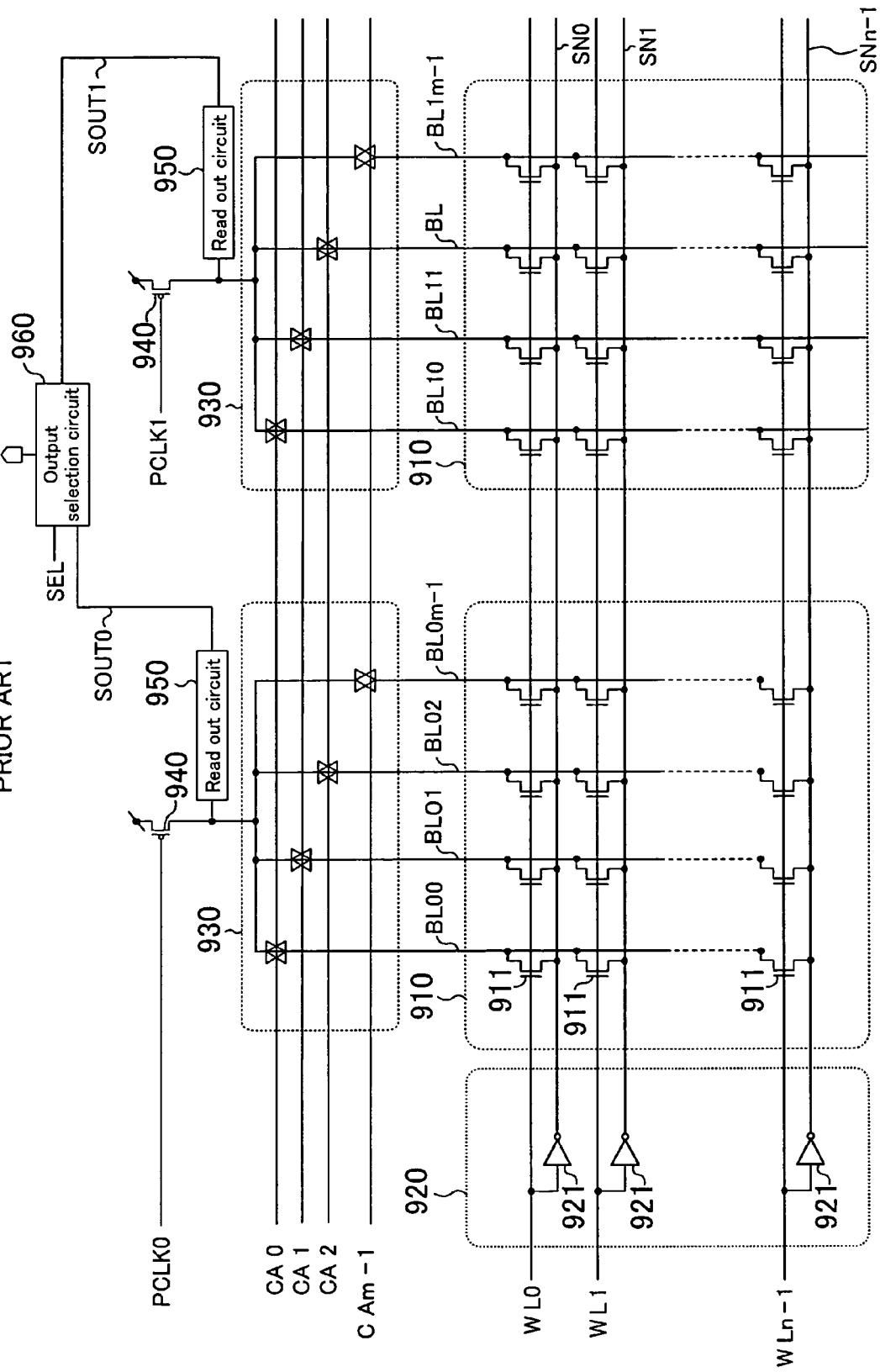
FIG. 27 is a block diagram illustrating a configuration of a known semiconductor memory device.
Figure 28:
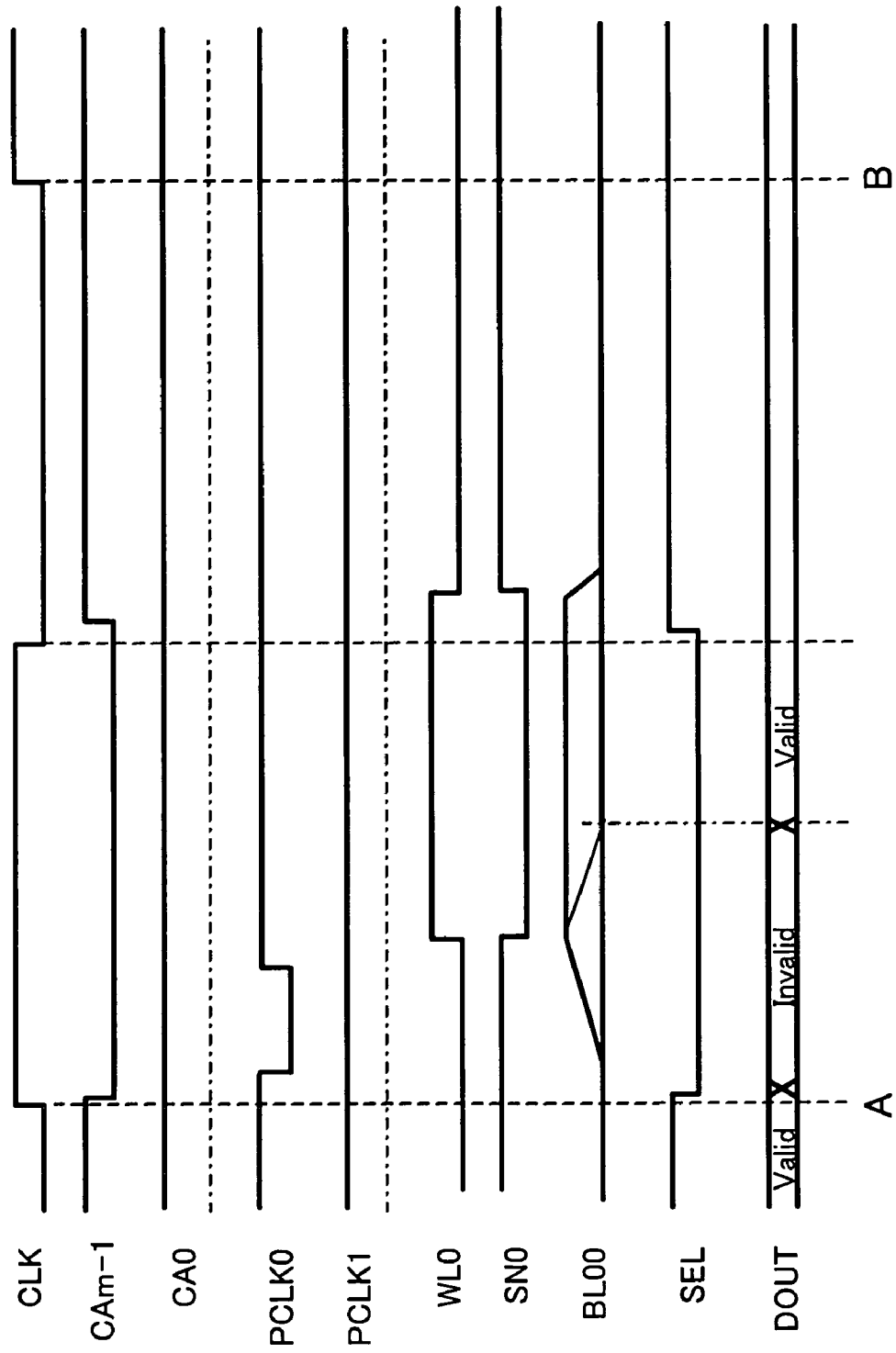
FIG. 28 is a timing chart for the known semiconductor memory device.

In the source bias control circuit 422 having the above-described configuration, for example, as shown in FIG. 26, when a precharge signal PR becomes the Low level, the n-channel transistor 421a is turned ON. Thus, the source bias potential is supplied to all of the source lines.

When the precharge signal PR becomes the High level again, the n-channel transistor 421a is turned OFF. Thus, the other ones of the source lines than the source line SN0 becomes a Hi-Z state.

As has been described, in the source bias control circuit 422, the necessary source bias potential is supplied during a precharge period and then one or more of the source lines which are not connected to the read-out target memory cell are turned to be in a Hi-Z state. Thus, power is consumed only during a period in which the source bias potential is supplied. That is, according to this embodiment, an error in a read out operation caused by the OFF leakage current can be prevented while power consumption can be reduced.

In the source bias control circuit 422, a potential of the VDD level is supplied to the gate terminal of the p-channel transistor 422d, thereby making one or more of the source lines which are not connected to a read-out target memory cell become a Hi-Z state. However, how to make one or more of the source lines which are not connected to a read-out target memory cell be in a Hi-Z state is not limited to the above-described example.

Switching between the Hi-Z state and the source bias supply state may be performed by, for example, connecting the gate terminal of the p-channel transistor 422d to an external terminal by mask option using a metal interconnect layer or ON/OFF controlling the p-channel transistor 422d using any one of the temperature detector circuits of the above-described embodiments.

The internal power supply circuit in each of the above described embodiments may be configured so that a potential can be adjusted from the outside of the semiconductor memory device. Thus, power consumption can be more efficiently reduced.

In a semiconductor device i.e., in a system-on-chip, in which a plurality of semiconductor memory devices are mounted on a single silicon substrate, an internal power supply circuit can be shared by the plurality of semiconductor memory devices.

In this embodiment, an example in which each of the memory cells is formed of an n-channel transistor has been described. However, even when each of the memory cells is formed of a p-channel transistor, the same effects can be achieved.

Levels (i.e., High level and Low level) of each signal and the correlation with their respective meanings have been described only for the purpose of illustrating examples and thus the present invention is not limited to those examples.

The components of the semiconductor memory devices described in each of the above-described embodiments and the modified examples may be provided in various different combinations within the limits of theoretical possibility.

As has been described, a semiconductor memory device according to the present invention has the effect of reducing power consumption in a stand-by period and in an operation period. Therefore, the present invention is useful as a circuit technique or the like for achieving increase in size and reduction in power consumption for a memory cell array in a semiconductor memory device such as a mask ROM and the like.

What is claimed is:

1. A semiconductor memory device in which memory cells are arranged in a matrix, each said memory cell being formed of a single transistor, the semiconductor memory device comprising:

a plurality of word lines provided so as to correspond to rows in the matrix, respectively, each said word line being connected in common to respective gate terminals of transistors located in an associated one of the rows;

a plurality of bit lines provided so as to correspond to columns in the matrix, respectively, each said bit line being connected to at least one of respective drain terminals of transistors located in an associated one of the columns;

a plurality of source lines provided so that each said source line corresponds to every adjacent two rows in the matrix and is connected in common to respective source terminals of transistors located in the two rows;

a precharge circuit for precharging the bit lines to a precharge potential according to a precharge signal indicating a period for precharging the bit lines;

a precharge signal generator circuit for generating the precharge signal; and one or more source bias control circuits for controlling, during an active period in which an operation of reading out data from one of the memory cells, at least one of the source lines which is not connected to said one of the memory cells which is to be read out to be in a state where a source bias potential that is higher than a ground potential and lower than a power supply potential is supplied.

2. The semiconductor memory device of claim 1, wherein each said source line is connected to associated transistors each constituting one of the memory cells in a doped layer.

3. The semiconductor memory device of claim 1, wherein each said source bias control circuit is provided so as to correspond to a power-of-two number of ones of the word lines.

4. The semiconductor memory device of claim 1, further comprising a plurality of internal power supply circuits for generating the source bias potential.

5. The semiconductor memory device of claim 4, wherein the internal power supply circuits are arranged in a one-to-one correspondence with the source lines, respectively.

6. The semiconductor memory device of claim 4, wherein each said internal power supply circuit is located in a memory cell substrate contact region in which each said memory cell is formed.

7. The semiconductor memory device of claim 4, wherein each said internal power supply circuit is provided so as to correspond to multiple ones of the source lines.

8. The semiconductor memory device of claim 1, wherein each said source bias control circuit is configured so as to control, during a stand-by period in which the semiconductor memory device waits for a memory access request, all of the source lines to be in a state where the source bias potential is supplied and, during the active period, one of the source lines connected to said one of the memory cells which is to be read out to be in a state where a ground potential or a power supply potential is supplied.

9. The semiconductor memory device of claim 8, wherein a value of data to be stored in one of the memory cells is determined, on the basis of whether or not each said memory cell is connected to one of the bit lines to which the respective drain terminals of transistors are connected, and wherein each said source bias control circuit is configured so as to be capable of setting the source bias potential to be a plurality of different levels and set, when a contact layer based on which the value of data to be stored is determined is formed, a level of the source bias potential.

10. The semiconductor memory device of claim 1, wherein the device is a ROM.

11. A semiconductor memory device in which memory cells are arranged in a matrix, each said memory cell being formed of a single transistor, the semiconductor memory device comprising:

a plurality of word lines provided so as to correspond to rows in the matrix, respectively, each said word line being connected in common to respective gate terminals of transistors located in an associated one of the rows;

a plurality of bit lines provided so as to correspond to columns in the matrix, respectively, each said bit line being connected to at least one of respective drain terminals of transistors located in an associated one of the columns;

a plurality of source lines provided so that each said source line corresponds to every adjacent two rows in the matrix and is connected in common to respective source terminals of transistors located in the two rows;

a precharge circuit for precharging the bit lines to a precharge potential according to a precharge signal indicating a period for precharging the bit lines;

a precharge signal generator circuit for generating the precharge signal;

a command decoder circuit for outputting, at a timing corresponding to a memory access request from the outside of the semiconductor memory device, an active signal indicating an active period in which the semiconductor memory device is in an operation of reading out data from one of the memory cells; and one or more source bias control circuits for controlling, during a period in which the active signal is output, at least one of the source lines which is not connected to said one of the memory cells which is to be read out to be in a state where a source bias potential that is higher than a ground potential and lower than a power supply potential is supplied.

12. The semiconductor memory device of claim 11, wherein each said source bias control circuit is configured so as to control, during a stand-by period, all of the source lines to be in a state where a ground potential is supplied and, during the active period, one of the source lines connected to one of the memory cells which is to be read out to be in a state where the ground potential or a power supply potential is supplied.

13. The semiconductor memory device of claim 11, wherein each said source bias control circuit is configured so as to perform the source line control according to the precharge signal.

14. The semiconductor memory device of claim 13, wherein each said source bias control circuit is configured so as to perform the source line control at a different timing from a timing of a start of a period in which one of the word lines is activated.

15. The semiconductor memory device of claim 11, further comprising a temperature detector circuit for detecting change in temperature of the semiconductor memory device, wherein each said source bias control circuits is configured so as to change the source bias potential according to the change in temperature of the semiconductor memory device detected by the temperature detector circuit.

16. The semiconductor memory device of claim 12, further comprising a temperature detector circuit for detecting change in temperature of the semiconductor memory device, wherein each said source bias control circuit is configured so as to change the source bias potential according to the change in temperature of the semiconductor memory device detected by the temperature detector circuit.

17. The semiconductor memory device of claim 13, further comprising a temperature detector circuit for detecting change in temperature of the semiconductor memory device,
wherein each said source bias control circuit is configured so as to change the source bias potential according to the change in temperature of the semiconductor memory device detected by the temperature detector circuit.

18. The semiconductor memory device of claim 14, further comprising a temperature detector circuit for detecting change in temperature of the semiconductor memory device,
wherein each said source bias control circuit is configured so as to change the source bias potential according to the change in temperature of the semiconductor memory device detected by the temperature detector circuit.

19. The semiconductor memory device of claim 1, wherein the precharge potential is the same potential as the source bias potential.

20. The semiconductor memory device of claim 13, wherein the precharge potential is the same potential as the source bias potential.

21. The semiconductor memory device of claim 15, wherein the precharge potential is the same potential as the source bias potential.

22. The semiconductor memory device of claim 16, wherein the precharge potential is the same potential as the source bias potential.

23. The semiconductor memory device of claim 17, wherein the precharge potential is the same potential as the source bias potential.

24. The semiconductor memory device of claim 18, wherein the precharge potential is the same potential as the source bias potential.

25. The semiconductor memory device of claim 11, wherein the device is a ROM.

26. A semiconductor memory device in which memory cells are arranged in a matrix, each said memory cell being formed of a single transistor, the semiconductor memory device comprising:
a plurality of word lines provided so as to correspond to rows in the matrix, respectively, each said word line being connected in common to respective gate terminals of transistors located in an associated one of the rows;
a plurality of bit lines provided so as to correspond to columns in the matrix, respectively, each said bit line being connected to at least one of respective drain terminals of transistors located in an associated one of the columns;
a plurality of source lines provided so that each said source line corresponds to every adjacent two rows in the matrix and is connected in common to respective source terminals of transistors located in the two rows;
a command decoder circuit for outputting, at a timing corresponding to a memory access request from the outside of the semiconductor memory device, an active signal indicating an active period in which the semiconductor memory device is in an operation of reading out data from one of the memory cells; and
one or more source bias control circuits for controlling, during a period in which the active signal is output, at least one of the source lines which is not connected to said one of the memory cells which is to be read out to be in a state where a source bias potential that is higher than a ground potential and lower than a power supply potential is supplied or a high impedance state.

27. The semiconductor memory device of claim 26, wherein each said source bias control circuit is configured so as to control, during a stand-by period in which the semiconductor memory device waits for a memory access request, all of the source lines to be in a state where the ground potential is supplied and, during the active period, one of the source lines connected to said one of the memory cells which is to be read out to be in a state where a ground potential or a power supply potential is supplied.

28. The semiconductor memory device of claim 26, further comprising a temperature detector circuit for detecting change in temperature of the semiconductor memory device,
wherein each said source bias control circuit is configured so as to control, during the active period, one or more of the source lines which are not connected to said one of the memory cells which is to be read out to a high impedance state or a state where the source bias potential is supplied, according to the change in temperature of the semiconductor memory device detected by the temperature detector circuit.

29. The semiconductor memory device of claim 1, further comprising:
an output circuit for storing and outputting data output to said one of the bit lines; and
a command decoder circuit for outputting, at a timing corresponding to a memory access request from the outside of the semiconductor memory device, an active signal indicating an active period in which the semiconductor memory device is in an operation of reading out data from one of the memory cells,
wherein the command decoder circuit is configured so as to reset the active signal by itself at its own timing, and
wherein the output circuit stores and outputs data output to said one of the bit lines at a timing when the active signal is reset.

30. The semiconductor memory device of claim 11, further comprising an output circuit for storing and outputting data output to said one of the bit lines,
wherein the command decoder circuit is configured so as to reset the active signal by itself at its own timing, and
wherein the output circuit stores and outputs data output to said one of the bit lines at a timing when the active signal is reset.

31. The semiconductor memory device of claim 26, further comprising an output circuit for storing and outputting data output to said one of the bit lines,
wherein the command decoder circuit is configured so as to reset the active signal by itself at its own timing, and
wherein the output circuit stores and outputs data output to said one of the bit lines at a timing when the active signal is reset.

32. The semiconductor memory device of claim 29, wherein each said source bias control circuit is configured so as to include a capability switching circuit for switching a capability of supplying the source bias potential among a plurality of different levels and switch, when the source bias potential is supplied to one or more of the source lines which are not connected to said one of the memory cells which is to be read out, a level of the capability of supplying the source bias potential during the active period.

33. The semiconductor memory device of claim 30, wherein each said source bias control circuit is configured so as to include a capability switching circuit for switching a capability of supplying the source bias potential among a plurality of different levels and switch, when the source bias potential is supplied to one or more of the source lines which are not connected to said one of the memory cells which is to be read out, a level of the capability of supplying the source bias potential during the active period.

34. The semiconductor memory device of claim 31, wherein each said source bias control circuit is configured so as to include a capability switching circuit for switching a capability of supplying the source bias potential among a plurality of different levels and switch, when the source bias potential is supplied to one or more of the source lines which are not connected to said one of the memory cells which is to be read out, a level of the capability of supplying the source bias potential during the active period.

35. The semiconductor memory device of claim 32, further comprising:
 a precharge circuit for precharging the bit lines to a precharge potential according to a precharge signal indicating a period for precharging; and
 a precharge signal generator circuit for generating the precharge signal,
 wherein each said source bias control circuit is configured so as to switch the capability of supplying the source bias potential once after a precharge period is completed.

36. The semiconductor memory device of claim 33, further comprising:
 a precharge circuit for precharging the bit lines to a precharge potential according to a precharge signal indicating a period for precharging; and
 a precharge signal generator circuit for generating the precharge signal,
 wherein each said source bias control circuit is configured so as to switch the capability of supplying the source bias potential once after a precharge period is completed.

37. The semiconductor memory device of claim 34, further comprising:
 a precharge circuit for precharging the bit lines to a precharge potential according to a precharge signal indicating a period for precharging; and
 a precharge signal generator circuit for generating the precharge signal,
 wherein each said source bias control circuit is configured so as to switch the capability of supplying the source bias potential once after a precharge period is completed.

38. The semiconductor memory device of claim 35, wherein the capability of supplying the source bias potential is larger before switching of the capability than after the switching of the capability.

39. The semiconductor memory device of claim 36, wherein the capability of supplying the source bias potential is larger before switching of the capability than after the switching of the capability.

40. The semiconductor memory device of claim 37, wherein the capability of supplying the source bias potential is larger before switching of the capability than after the switching of the capability.

41. The semiconductor memory device of claim 32, wherein each said source bias control circuit is configured so as to change, during the active period, one or more of the source lines which are not connected to said one of the memory cells which is to be read out to a state where the source bias potential is supplied and then to a high impedance state.

42. The semiconductor memory device of claim 33, wherein each said source bias control circuit is configured so as to change, during the active period, one or more of the source lines which are not connected to said one of the memory cells which is to be read out to a state where the source bias potential is supplied and then to a high impedance state.

43. The semiconductor memory device of claim 34, wherein each said source bias control circuit is configured so as to change, during the active period, one or more of the source lines which are not connected to said one of the memory cells which is to be read out to a state where the source bias potential is supplied and then to a high impedance state.

44. The semiconductor memory device of claim 32, further comprising a temperature detector circuit for detecting change in temperature of the semiconductor memory device,
 wherein each said source bias control circuit is configured so as to switch the capability of supplying the source bias potential, according to the change in temperature of the semiconductor memory device detected by the temperature detector circuit.

45. The semiconductor memory device of claim 33, further comprising a temperature detector circuit for detecting change in temperature of the semiconductor memory device,
 wherein each said source bias control circuit is configured so as to switch the capability of supplying the source bias potential, according to the change in temperature of the semiconductor memory device detected by the temperature detector circuit.

46. The semiconductor memory device of claim 34, further comprising a temperature detector circuit for detecting change in temperature of the semiconductor memory device,
 wherein each said source bias control circuit is configured so as to switch the capability of supplying the source bias potential, according to the change in temperature of the semiconductor memory device detected by the temperature detector circuit.

47. The semiconductor memory device of claim 26, wherein the device is a ROM.

* * * * *